(12) United States Patent
Swift et al.

(10) Patent No.: US 8,234,960 B2
(45) Date of Patent: Aug. 7, 2012

(54) ELECTRICAL COMPONENT, MANUFACTURING SYSTEM AND METHOD

(75) Inventors: Joseph A. Swift, Ontario, NY (US);
Stanley J. Wallace, Victor, NY (US);
Richard W. Seyfried, Williamson, NY (US); Kathleen A. Feinberg, Rochester, NY (US); Roger L. Bullock, Webster, NY (US)

(73) Assignee: Xerox Corporation, Norwalk, CT (US)

( * ) Notice: Subject to any disclaimer, the term of this patent is extended or adjusted under 35 U.S.C. 154(b) by 108 days.

(21) Appl. No.: 12/913,436

(22) Filed: Oct. 27, 2010

(65) Prior Publication Data

US 2011/0035932 A1     Feb. 17, 2011

Related U.S. Application Data

(62) Division of application No. 11/982,999, filed on Nov. 6, 2007, now Pat. No. 7,847,191.

(51) Int. Cl.
*B26D 5/08* (2006.01)
(52) U.S. Cl. ............................................. 83/549; 451/75
(58) Field of Classification Search .................. 451/75; 324/754; 219/121.66; 83/549
See application file for complete search history.

(56) References Cited

U.S. PATENT DOCUMENTS

| | | |
|---|---|---|
| 4,553,191 A | 11/1985 | Franks, Jr. et al. |
| 5,139,862 A | 8/1992 | Swift et al. |
| 5,250,756 A | 10/1993 | Swift et al. |
| 5,267,866 A | 12/1993 | Swift et al. |
| 5,281,771 A | 1/1994 | Swift et al. |
| 5,282,310 A | 2/1994 | Rommelmann et al. |
| 5,295,490 A | 3/1994 | Dodakian |
| 5,396,044 A | 3/1995 | Orlowski et al. |
| 5,399,424 A | 3/1995 | Rommelmann et al. |
| 5,563,976 A | 10/1996 | Rowland |
| 5,599,615 A | 2/1997 | Swift et al. |
| 5,885,683 A | 3/1999 | Swift |
| 5,933,309 A | 8/1999 | Smith |
| 6,053,777 A | 4/2000 | Boyle |
| 6,159,056 A | 12/2000 | Boyle |
| 6,265,046 B1 | 7/2001 | Swift |
| 6,275,054 B1 | 8/2001 | Boyle |
| 6,652,326 B2 | 11/2003 | Boyle et al. |
| 6,667,629 B2 | 12/2003 | Souza et al. |
| 6,685,492 B2 | 2/2004 | Winter et al. |
| 6,709,878 B2 | 3/2004 | Akram et al. |
| 6,967,497 B1 | 11/2005 | Hembree |
| 6,992,496 B2 | 1/2006 | Winter et al. |
| 7,047,857 B2 | 5/2006 | Adkins |
| 7,186,167 B2 | 3/2007 | Joslin |
| 7,207,868 B2 | 4/2007 | Takehara et al. |
| 2008/0040920 A1 | 2/2008 | Brackenbury et al. |

OTHER PUBLICATIONS

"What is Carbon Fiber?", 4 Pages, Zoltek Corporation, PANEX® Products, 2005.

*Primary Examiner* — Chau Nguyen
(74) *Attorney, Agent, or Firm* — Alix, Yale & Ristas, LLP

(57) ABSTRACT

Disclosed herein is an electrical component comprising a segment having a diameter in the range of about 1 micrometers to about 10 cm, the segment comprising a plurality of non-metallic, resistive fibers in a non-metallic binder. The segment is precisely trimmed to impart to the segment an electrical resistance within 1% of the desired resistance value. A manufacturing system and methods of manufacturing components having precise specifications also are disclosed.

16 Claims, 15 Drawing Sheets

FIG. 4
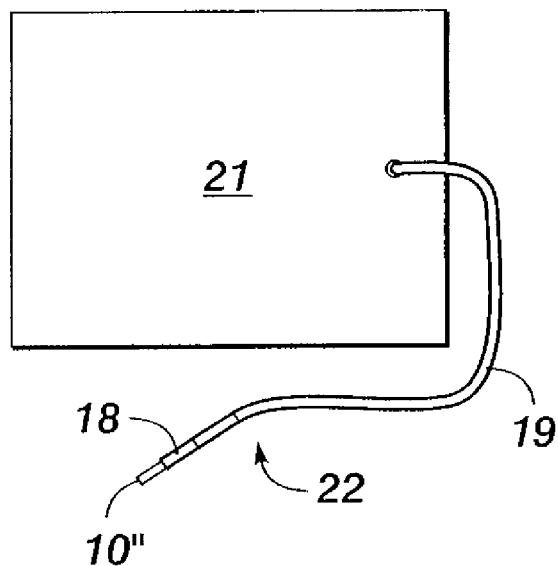
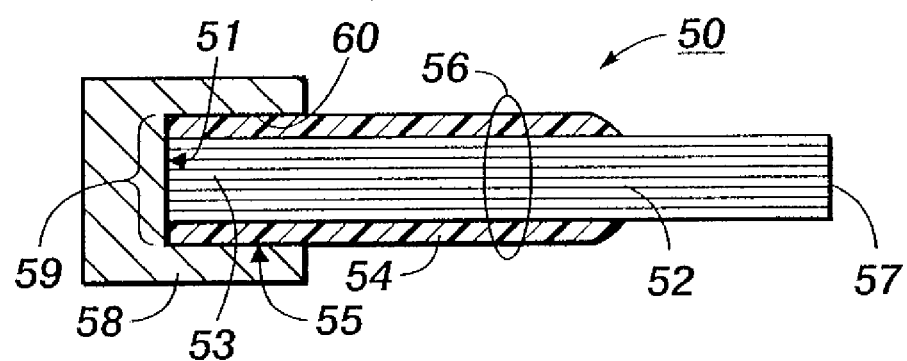
FIG. 5

ELECTRICAL COMPONENT, MANUFACTURING SYSTEM AND METHOD

This application is a divisional of U.S. application Ser. No. 11/982,999 filed Nov. 6, 2007, now U.S. Pat. No. 7,847,191 issued Dec. 7, 2010.

BACKGROUND

The embodiments disclosed herein relate to electrical components, and more particularly to the manufacture of electrical components from composite materials.

Transmission of low voltage digital, high frequency and other signals, including mixed mode signals over wired networks generally requires use of multi-element connectors which enable splicing of lengths and particularly long lengths of transmission lines together, or, to intersect or unite a signal source line together with several transmission reception lines. Optionally one or more of the intersecting connectors may provide a connection path for sensing and monitoring features of interest on or along the signal transmission line. Generally, all these connectors use metal contact elements to separably unite the signal path wires into an effective transmission network. The connector elements typically employ a mate-able contact pin and socket design for the primary signal conductor's path and one or more concentrically aligned, shield or ground path connector elements which may have a threaded barrel feature to the outermost metal connector element. Separation of the line while it is in service and used for active signal transmission can cause an undesired and potentially harmful spark or arc to occur. It would be a highly desired feature of the connector to enable reliable signal level connection while suppressing for example unwanted arcing upon separation of the active line or an element that is joined to the active line.

Further, automated testing of integrated circuit components as well as other active and passive circuit members including circuit boards is often conducted using a contact probe to temporarily connect the device under test (DUT) to a test instrument. A signal is communicated by the contact probe through a suitable interconnection, which may include electric cables, hook up wires, connectors, and the like to the instrument which can process and/or display details of interest relating to the signal(s) of interest. The instrument may be any applicable test instrument which may include a voltmeter, an ammeter, an ohm meter, a multimeter, an oscilloscope, and the like. The signal of interest stemming from the DUT may originate from operation of the device under actual use conditions, under simulation or stress conditions, or under a burn in test protocol. Alternately, the instrument or related circuitry may provide a reference signal or power to the DUT while simultaneously extracting a sample return signal for characterization or display. Often, more than one probe is used to simultaneously monitor more than one signal and/or more than one location. The number of probes can be in the range of 10 to 100 or more. In this case, individual probes are arranged into an array of probes, which may be known by such terms as a bed-of-nails.

Characteristic of the probes in widespread contemporary use are probe elements having metal contact tips. The disadvantage of using metal-tipped probes is that under certain conditions the metal-to-metal contact between the probe and circuit member potentially can introduce an undesired electric bias or even a surge into the measurement, particularly in AC measurements owing to a capacitance and/or inductance the metal tip induces into the test circuit. In this case, inaccurate results are produced. Other disadvantages to the use of metal tip probes include; mechanical damage to the probe or to the circuit member such as scratching, denting, piercing, and even welding under high current conditions, contamination of the DUT due to transfer of metal surface oxides, and the like. A further disadvantage to metal probes used in large arrays is that they are generally heavy and require costly support structures to maintain positional precision.

Electric probes are also used in the medical industry and in the medical research field as temporary contacts to a wide range of materials and surfaces. These include such materials as human or animal skin, internal organs of the same, cells and groupings of cells, and the like. Often these probes are made from non-metal conductive materials such as inorganic salts in a suitable adhesive or gel medium which can adhesively join to and thereby serve to interconnect the surface of interest to a test instrument, such as an electrocardiogram monitor, a skin conductivity tester, and the like. The disadvantage to these non-metallic probes is that an adverse chemical reaction or allergic reaction may occur between the test subject and the contacting probe.

Certain electrical components used in electrostatographic printing machines are manufactured from composites, including composite plastics, that contain at least one filler which can be in the form of fine particles or fibers. The composites may be formed from a non-metallic pultruded composite member having multiple, generally circular cross section carbon fibers in a polymer matrix One of the difficulties with manufacturing such electrical components from composites has been in making thin disk-like elements or any configurations having thin sectional areas from, for example a pultruded carbon fiber filled rod such that the elements can be sized to fit into existing designs and packages, such as switch or integrated circuit packages, connector bodies, circuit board vias, and the like. Difficulties have been encountered with mechanically cutting small diameter composite rods into thin disks since the polymer matrix is frictionally heated and softened during the cutting process but then some of the polymer can condense or otherwise flow onto and around the ends of the fibers thereby contaminating the cut surfaces and preventing the necessary fiber-rich and/or pristine contact structure at the end of the disk. Laser cutting of such pultruded carbon fiber composite rods into thin disks has similarly proven difficult because the fibers conduct heat generated by the laser and the heat burns away the matrix polymer from around the fibers even at distances removed from the plane of the laser cut. Waterjet and laser milling of large diameter rods into somewhat smaller diameter rods has equally been problematic. The presence of microvoids and polymer-rich islands that can often exist within the cross section of the parent rod act to interrupt and/or diffuse the jet or beam in a manner that produces a flaw in the surfaces of the milled rod. These flaws are generally not acceptable to many applications that require a flaw-free surface on the rod or resultant discs produced from the rod. Similar difficulties are encountered in machining other composite materials and in forming shapes other than disks and rods. The difficulties are believed to stem from the differences in properties that exist between the filler or fillers used in the composite and the binder which is typically a polymer that serves to unify the composite into a solid structure, such as a rod. Particularly problematic is the case where the mass of filler(s) is a large fraction relative to the mass of the composite, for example equal to or more than about 10% by weight, and where the physical and/or geometric properties of the filler are greatly different from those of the host polymer. Typically the hardness of the filler is different, for example much greater than that of the polymer while often, at the same time, the size of the filler particles or fibers residing in the parent composition can be as large ore even much larger than the final thickness of a thin disc cut from the parent rod. Thus the jet of the fluid jet must pass trough both the filler phase(s) and the host polymer phase comprising the composite with equally effectiveness and without disturbing the compositional balance that exists or otherwise altering one phase with respect to the other or even to the parent composite.

It is known from commonly assigned U.S. Pat. No. 5,599,615 to make high performance electrical contacts that include a composite member with a plurality of electrically conductive, nonmetallic fibers in an electrically conductive metallic matrix. Further, U.S. Pat. No. 7,220,131 describes electromechanical devices having a plurality of bundles of fibers for interconnecting two planar surfaces which include surfaces of printed wiring boards and other related components. Composite plastics have not been used extensively in making signal transmission connectors, or test instrument or medical probe tips, however, because of such factors for example as limitations to critical electrical or mechanical property (CPs) tolerances and contact resistance predictability, as well as a lack of commercial availability.

It is known to use passive trimming in the electronics industry to remove material from a resistor to increase its electrical resistance. Known commercial processes employ a $CO_2$, CO, Q-switched Yag, or other type of laser. However, lasers, along with all means of mechanical cutting (such as abrasive wheel, lathe milling, ElectroDischarge Machining (EDM) and Plunge EDM) are known to adversely affect the surface properties of certain types of components, and thus are unsuitable for certain applications. In U.S. Pat. No. 5,399,424, waterjet cutting is employed to cut thin disc-shaped members out of pultruded carbon fiber rods used in making electrical contacts.

It would be useful to develop fibrous electric components that have extremely precise electrical properties, including electrical resistance, and to provide manufacturing techniques and apparatus and apparatus for producing such components which would overcome the foregoing difficulties and others while providing better and more advantageous overall results.

SUMMARY

There is provided a set of electrical components each of which comprises a segment having a diameter in the range of about 1 micrometer to about 10 centimeters comprising a plurality of resistive fibers in a binder, each electrical component in the set having an electrical resistance within 1% of the resistance of each of the other electrical components in the set. Another embodiment is an electrical component comprising a segment having a diameter in the range of about 1 micrometer to about 10 cm, the segment comprising a plurality of non-metallic, resistive fibers in a non-metallic binder. The segment is precisely trimmed to impart to the segment an electrical resistance within 1% of the desired resistance value.

Another embodiment is an electrical component comprising a segment having a diameter in the range of about 1 micrometer to about 10 centimeters. The segment includes a core containing a plurality of resistive fibers in a binder and at least one coating layer formed over at least a portion of the core. The coating layer is precisely sized to impart to the segment an electrical resistance value within 1% of the desired resistance value.

Also provided is a method of making an electrical component comprising obtaining a segment of a material comprising a plurality of fibers in a binder. The segment is cut to a first length and its electrical resistance is measured. The amount of additional cutting required to obtain the desired electrical resistance of the segment is determined, and the segment is precisely cut to the final dimensions using at least one of a fluid jet and a laser.

Yet another embodiment is a method of making an electrical component comprising forming a non-metallic core comprising a plurality of fibers in a binder, and forming a non-metallic coating layer over at least a portion of the core. Portions of the non-metallic coating layer are removed to modify the electrical resistance of the electrical component to a desired overall resistance.

Furthermore, there is provided a manufacturing system for machining components from a composite feed material. The manufacturing system comprises a lathe assembly including a collet adapted to grip a free end of the feed material, a part collection and handling assembly is adapted to engage the feed material and advance the free end of the feed material toward the lathe assembly, and a fluid jet assembly having a fluid jet nozzle disposed intermediate the part collection and handling assembly and the lathe assembly.

The manufacturing system further comprises a source of liquid having no abrasive particles. The fluid jet nozzle ejects the abrasive-free liquid against a portion of the feed material disposed intermediate the part collection and handling assembly and the lathe assembly such that the abrasive-free liquid machines the feed material portion.

The manufacturing system further comprises an indexing assembly including first and second substantially parallel Z rails and an X slide extending from the first Z rail to the second Z rail. First and second end portions of the X slide are slidably mounted to the first and second Z rails, respectively. The Z rails define a Z direction and the X slide defines an X direction that is substantially perpendicular to the Z direction.

The part collection and handling assembly is slidably mounted to the X slide proximate to the first end portion and the lathe assembly is slidably mounted to the X slide proximate to the second end portion.

The indexing assembly also comprises a Z drive motor connected to the X slide to move the X slide along the Z rails in the Z direction and first and second X drive motors connected to the part collection and handling assembly and the lathe assembly, respectively, for moving the part collection and handling assembly and the lathe assembly along the X slide in the X direction. A controller is in communication with the X drive motors and the Z drive motor.

The lathe assembly also includes a lathe table, a headstock and a drive motor. The lathe table is connected to the second X drive motor and is slidably mounted to the X slide. The headstock is mounted to the lathe table. A collet operator is in communication with the controller.

In one embodiment, the part collection and handling assembly is a vacuum box assembly that includes a vacuum assembly table, a housing mounted to the vacuum assembly table, and a vacuum source to draw a vacuum in the housing. The vacuum assembly table is connected to the first X drive motor and slidably mounted to the X slide.

The part collection and handling assembly also includes a pair of pinch rolls disposed within the housing on opposite sides of the X axis to enable one or more material handling operations. A pinch roller motor is connected to the pinch rollers. The pinch roller motor is in communication with the controller. A support bushing is disposed within the housing proximate to the material output opening.

There is also provided a method of manufacturing components from a carbon/polymer feed material. The method comprises receiving an order to produce components. A free end of the feed material is gripped with a collet of a lathe assembly. The feed material free end is a first end of a workpiece that extends in the X direction. The workpiece is positioned proximate to a nozzle of a fluid jet assembly, for a first machining operation. The first machining operation is preformed on the workpiece, and it is determined whether the machining operations required to complete production of the component have been completed. If the machining operations required to complete production of the component have not been completed, a subsequent machining operation is performed. If the machining operations required to complete production of the component have been completed, it is determined whether additional components must be manufactured to complete the order. If the order is not complete, a free end of the feed material is gripped with a collet of a lathe assembly. If the order is complete, the system waits to receive a new order to produce components.

Positioning the workpiece for a first machining operation includes positioning a second end of the workpiece proximate to the fluid jet assembly nozzle. The first machining operation generally includes separating the workpiece from the feed material with a fluid jet emitted by the fluid jet nozzle.

Gripping the feed material free end includes pushing the feed material free end through a housing of a part collection and handling assembly. The feed material is engaged with a pair of pinch rollers disposed within the part collection and handling assembly. The lathe assembly collet is opened and the part collection and handling assembly and lathe assembly are moved in the X direction toward each other until the feed material free end is positioned within the lathe assembly collet. The collet is then closed to grip the feed material free end.

Positioning the workpiece for a first machining operation also includes moving the part collection and handling assembly and lathe assemblies in the X direction away from each other until a predetermined length of the feed material is suspended between the part collection and handling assembly and lathe assembly.

Performing the first machining operation includes positioning the fluid jet nozzle whereby a fluid stream emitted by the fluid jet nozzle is initially tangential to one side of the feed material. The stream may optionally be perpendicular or at a pre-determined angle with respect to the length-wise axis of the workpiece. The fluid jet pump is energized and the fluid jet nozzle is moved in a Z direction whereby the fluid jet emitted from the fluid jet nozzle machines a segment of the feed material impacted by the fluid jet. The fluid jet pump is de-energized when the operation is complete, for example when the workpiece is separated from the feed material.

Performing a subsequent machining operation includes a material handling operation that involves positioning the workpiece whereby a fluid jet emitted by the fluid jet nozzle will impact the workpiece at a new, first location. The fluid jet pump is energized and the fluid jet nozzle is moved, or the workpiece is moved, or both are moved relative to each other whereby the fluid jet emitted by the fluid jet nozzle impacts the workpiece at or across a second location. The fluid jet pump is de-energized when a predetermined portion of the workpiece is removed.

Performing a subsequent machining operation also includes positioning the workpiece whereby the fluid jet nozzle is proximate to the workpiece at a first location. The workpiece is rotated with the collet. The fluid jet pump is energized and the workpiece is advanced in the Z direction to a predetermined cut depth. The workpiece is advanced in the X direction a predetermined cut length to a second location, the fluid jet machining all of the composite material impacted by the fluid jet. The fluid jet pump is then de-energized.

Performing an subsequent machining operation further includes positioning the workpiece whereby the fluid jet nozzle is proximate to the workpiece at a position that is between the first and second locations, for example half-way between the first and second locations. The fluid jet pump is energized and the workpiece is advanced in the Z direction whereby the fluid jet severs the workpiece into two parts. The fluid jet pump is then de-energized.

Performing further subsequent machining operation includes mounting the severed end of each of the severed parts to a metal fitting. The severed part is supported with a suitable support bushing and the metal fitting is gripped with the lathe collet. The workpiece is positioned whereby the fluid jet nozzle is proximate to a predetermined location on the initially severed part. The fluid jet pump is energized and the workpiece is advanced in the Z direction whereby the fluid jet severs a sacrificial portion of the severed part thereby creating a component assembly having a precisely controlled overall length. The fluid jet pump is then de-energized.

BRIEF DESCRIPTION OF THE DRAWINGS

The present disclosure may be better understood and its numerous objects and advantages will become apparent to those skilled in the art by reference to the accompanying drawings in which:

FIG. 4 shows the component of FIG. 1 as part of a sensor or probe assembly connected to a test circuit or test instrument.

FIG. 5 schematically shows another embodiment of an electrical component

DETAILED DESCRIPTION

Figure 1:
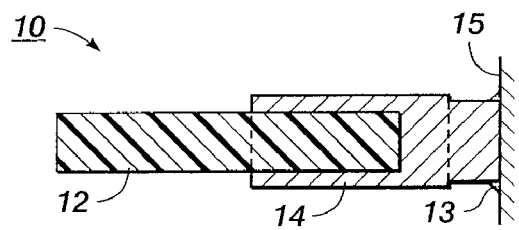
FIG. 1 schematically shows one embodiment of an electrical component.

Electrical components and methods for precisely forming such components are provided in which non-metallic materials are employed. Using the manufacturing techniques described herein, precise electrical specification requirements for such properties as electrical resistance and electrical resistance tolerances coupled with precise dimensions and dimensional tolerances for size, including length, diameter, volume and the like, can be met. The component and manufacturing method can be used in making non-metallic contact elements, connectors, contacts, arrays of contacts, interconnects and the like for use in for example signal transmission, sensing, or switching connectors, as well as for medical and electronic test instrument probes including instruments for testing of high-speed, mixed signal IC circuit applications, and for other applications in which electric components are required to meet very precise electrical resistance and dimensional specifications.

As used herein, "electrical component" is a component or member that allows for passage of electrical current, charge, or voltage. Electrical components include but are not limited to electronic and electrostatic components. The term "resistance" as used herein refers to electrical resistance unless otherwise specifically indicated. The term "fiber" used herein refers to non-metallic fibers which exhibit a desired level of electrical conductivity. The term "binder" or "binder resin" as used herein refers to a matrix material that retains the fibers in place and may provide for one or more mechanical or structural features. An "electrical contact" as used herein refers to a resistive electrical component that permits current flow between conducting parts to be controlled within a target region, including but not limited to contacts used in signal transmission, sensing probes and other analog, high frequency, or digital electrical connections. "Electrical contact" as used herein refers to a controlled conductivity.

In order to make ultra-high performance electrical contacts, manufacturing methods are needed that provide for very tight tolerances, particularly for narrow specification ranges of properties such as electrical resistance. Obviously, this requires that very tight tolerances and generally narrow specification ranges be under control for key properties such as electrical resistance. In general, the subject components are small in size and must be of sufficient strength to meet the requirements of the intended application. For certain end uses, an electrical contact requires a resistance with a tolerance of +/−0.5% or less. However, the commercial norm for resistance tolerances of non-metallic contacts is about +/−100 to 1000% for commercially available electrical contacts.

The electrical component described herein comprises a plurality of aligned fibers and a binder. The component is manufactured by obtaining a segment of fibrous component material retained within a suitable binder material to form a structurally solid, rigid, or semi-rigid structural element, overcutting the element to a length slightly longer than the desired final length, assembling the fibrous component material into the shape of an electrical component, measuring the resistance of the component, and trimming the component to obtain the desired resistance value using a precise cutting technique. A final resistance measurement can then be made after the precise cutting is completed to ensure that the desired resistance value is obtained.

Figure 2:
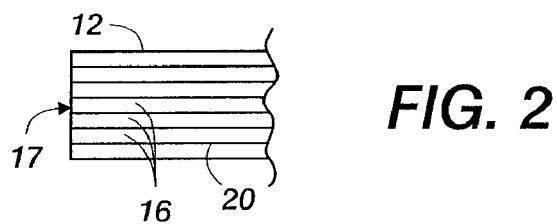
FIG. 2 schematically shows the fiber orientation in the electrical component shown in FIG. 1.
Figure 3:
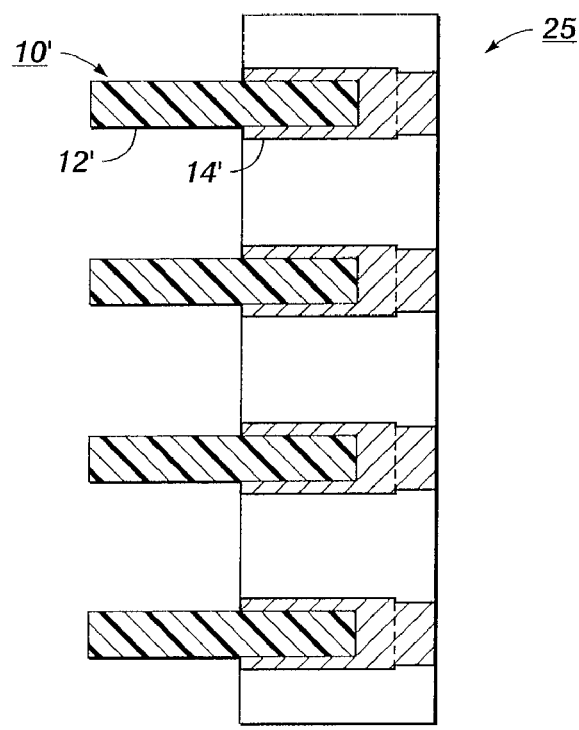
FIG. 3 schematically shows an embodiment of an array of electrical components.

Referring to FIG. 1, one embodiment of an electrical component 10 is shown. The component 10 includes a resistive fiber-filled composite plastic rod-shaped member 12 in a mounting 14. The mounting 14 is typically electrically conductive and can be a metal or non-metal and can have the same or similar internal shape and size as the rod member's external surface. The rod 12 contains a plurality of aligned fibers 16, depicted in FIG. 2. In the illustrated embodiment, the fibers are held together with a binder 20. The tip portion 17 of the component 10 is made up of the tips of a plurality of individual carbon fibers that run lengthwise along the length of the contact member. Typically, there are about 1 to about 10,000 individual carbon fibers, or about 100 to about 6,000 or about 500 to about 3,000. Each of the fibers has a diameter that is typically in the range of about 2 to 100 microns. When the electrical component is used as a contact for a separable connector or probe, for example, the area of the tip portion 17 determines the number of fibers contained therein. The area of the tip portion 17 usually is selected such that it is equal to or slightly smaller than the area of the mating element or test surface. Rod tip dimensions may depend in part, for example, upon the size and trace density of the circuits being contacted by the rod tip portion 17. Multiple contacts or tips can be used in an array 25 of components 10' having rods 12' and mountings 14' as shown in FIG. 3 to conduct multiple simultaneous tests.

The electrical component 10 can be used in medical or electrical test instruments designed to make very precise electrical measurements. One non-limiting example of such an instrument is a high frequency oscilloscope. FIG. 4 shows an oscilloscope 21 with a probe assembly 22. The probe assembly 22 includes a resistive, fiber filled contact member 10" in a non-conductive mounting member 18 suitable to permit safe human handling of the contact tip. The mounting member 18 and an electric cable or cord 19 together act as an electrochemical interface between the electrical component 10" (in this case an electrical contact) and the circuitry of the oscilloscope 21. The component 10" serves as an electromechanical interface between an element being probed (such as an integrated circuit) and the oscilloscope 21.

In one embodiment, the assembly 22 is an oscilloscope high voltage probe assembly that uses an electrical contact that does not interfere with operation of a high frequency circuit (i.e. operating within the frequency range of about 1 to 20+GHz) during measurements that are made as part of normal operation of the DUT which may be an integrated circuit and/or related circuit device. The fibers contained within the contact element 10 are selected to have a resistance that is sufficient to buffer the operating DUT from any current or voltage surges that may occur upon insertion or desertion of the probe into or out of the functioning circuit. Further, the resistance value for the fiber containing contact is selected to fall below a threshold that would inhibit or mitigate the signal passing through the contact to the instrument. Thus, by selecting a value for the contact's resistance to fall above a low level threshold that prevents instantaneous current surges and below the high level threshold for reliable signal passage to the instrument, an operational range for the contact's resistance can be determined. Naturally, other thresholds may apply depending upon the precise circuit in which the contact is being used. Once a specified resistance range for the contact is determined for the particular circuit and measurement apparatus, every contact member that is used in an array of contacts to simultaneously contact and measure various points within a large DUT should have resistance values that are precisely the same, or alternatively, should fall within a close tolerance range. Examples of close tolerance ranges are +/−1% or even +/−½% or even less.

As noted above, each fiber has a resistance ($R_{fib}$). In many cases, the resistance value is obtained by selected heat process treatment of a suitable precursor fiber during the manufacturing process used to make the resistive fibers. Carbonization of precursor fibers to make conductive carbon fiber is well known in the art. Likewise, manufacturing processes used to make partially carbonized or resistive carbon fiber are known. Several non-limiting examples of suitable treatment techniques for carbon fibers include controlled temperature carbonization of polyacrylonitrile (PAN) precursor fiber such that the maxim carbonization temperature that the PAN precursor is exposed to falls in the range of, for example 900 to 950 C, while in an inert atmosphere of nitrogen gas for example. In one embodiment, the value of $R_{fib}$ falls within a range of 196 and 207 megaohms per meter as measured on a 1,000 filament containing bundle which is also known as a tow.

Non-limiting examples of fibers to be used are filled or unfilled textile fibers such as polyester and nylon composite fibers containing appropriate conductive fillers such as carbon black, carbon nanotubes, quaternary ammonium compounds, boron nitride, ionic salts and short lengths of conductive carbon fibers. In many cases the fibers are required to have a high tensile and bending strengths. One suitable fiber comprises a plurality of carbon fibers in a polymer matrix and is known as CarbonConX™ (Xerox Corp.). Low pressure pultrusion is used to bundle thousands of carbon fibers, ensuring redundancy in the contact point within a suitable binder resin. This process often involves pulling the carbon fibers and a thermoplastic or thermosetting polymer through a shaping and curing or solidification die. The contacts are characterized by high density of evenly distributed conduction sites, high immunity to the formation of non-conductive films, and high contact integrity in contact degrading environments. As noted earlier, selection of a fiber will depend in part upon the desired electrical resistance and the requirements of the intended application.

In one embodiment, the precursor fiber is a polyacrylonitrile (PAN) and it is treated by controlled temperature carbonization. The details of this process are provided in commonly assigned U.S. Pat. No. 4,553,191, the contents of which are incorporated herein by reference in their entirety.

As indicated above, the fibers 16 are held in place using a binder 20. The hinder 20 can be a polymer, ceramic, glass, or another suitable non-metal. The binder 20 usually is a thermoplastic or thermoset polymer that binds the fibers 16 together with the necessary mechanical strength. A binder 20 that does not affect the resistance properties of the fibers typically is selected. Suitable polymers include but are not limited to acrylics, polyesters, polyimides, polyamides, polystyrenes, polysulphones, and epoxies. Furthermore, a mechanical bundling component such as a sleeve, for example a heat shrinkable polymeric sleeve or a heat deformable member can be used as a binder to hold the fibers mechanically together.

For an instrument probe used to test integrated circuits, the fiber bundle typically has a diameter in the range of about 1 micron to about 10 centimeters or about 5 microns to about 5 centimeters, or about 10 microns to about 1 centimeter.

The aligned fibers can be modeled in the framework of an electric circuit having a number of resistors N in parallel with a total resistance $R_T$ numerically equal to $N \times R_{fib}$. The values for $R_{fib}$ and $R_T$ are closely interrelated and selected to enable the contact element to serve to buffer the test circuit from charge (or current) exchange during contact with the contacting connecter member or contact probe, while at the same time enabling high precision, high frequency signal transmission, sensing, and measurement.

The production process used to make the resistive fibers yields fiber resistances on a lot-to-lot basis and on a temporal basis that have relatively wide variation. The combined variation for all sources (i.e. lot and temporal) can generally fall in the range of one to two orders of magnitude. However, on a within-lot basis, the variation is typically much smaller, for example within one order of magnitude. Depending upon the desired resistance of the fiber lot, typical lot-to-lot resistance variations can fall in the order of about ½ to 1%. In general, the more conductive carbon fibers produced at high heat treatment temperatures exhibit less resistance variation than the more resistive fibers. Changes in resistance with time after manufacture are known as temporal variations which can also contribute to the overall variation. The fact that several factors contribute to produce a wide overall variation makes it difficult to make composite plastics with tightly controlled resistances.

In manufacturing the electrical component, an overcut is made by a suitable cutting technique. In one embodiment, a fluid jet, frequently a waterjet, is used to cut and configure the face of the contact region because the fluid jet uniquely produces a contact face having a surface that 1) can be profiled into a variety of desired shapes, profiles, and sizes, 2) is clean and free of contamination, 3) has a surface composition that closely mirrors the bulk composition, and 4) does not alter the chemical, electrical, or mechanical properties of the fiber or polymer. Furthermore, no noxious gases or liquids are used in fluid jet cutting and the process does not create hazardous materials or vapors. Unlike laser cutting, no heat affected zones or thermal-mechanical stresses are left on or within a fluid jet cut surface.

An integrated, multi-step cutting method, which optionally can be automated, can be used involving a specific manufacturing sequence. First, a fluid jet or another suitable cutting technique is used to over-cut the length dimension of the rod feedstock that has a resistive carbon fiber and binder formed into a pultruded small diameter (e.g. 0.022 inch) rod. The initial cutting is done with a custom, high precision, fluid jet cutting process and results in rod lengths slightly longer (e.g. in the range of about 10 to 50% longer) than appears in the final assembly. Second, the cut rod is allowed to dry by, for example, passage through a convective oven, and is optionally allowed to cool. Third, the over-length rod is assembled into a suitable interface or final mounting and secured in place. In the embodiment shown in FIG. 1, the interface is a metal mounting element that is secured in place onto a suitable substrate 15 by for example a suitable adhesive or solder 13. The contact element 12 can be secured into the mounting by any suitable means, for example by press fit, crimping and/or by use of a conductive adhesive. Alternately, the contact member 12 may contain surface undercuts, protrusions and or steps (not shown) that interlock with similar features the inside surfaces of the mounting member.

Fourth, the end-to-end resistance of the assembly is measured (manually or by suitable automated instrumentation) and compared to a look-up-table that maps a range of lengths to resistance values. Fifth, a final trim to length cut is made by the fluid jet on the contact end that protrudes from the assembly to create a rod length that has the desired resistance value for the assembly that falls within the desired tolerance range. Fluid jets such as waterjets are capable of achieving cut-to-length tolerances of 0.0005 inches or even less. Optionally, a confirming measurement of the R value can be made immediately after the component is allowed to thoroughly dry. The second and third steps optionally can be reversed in the sequence.

Figure 9:
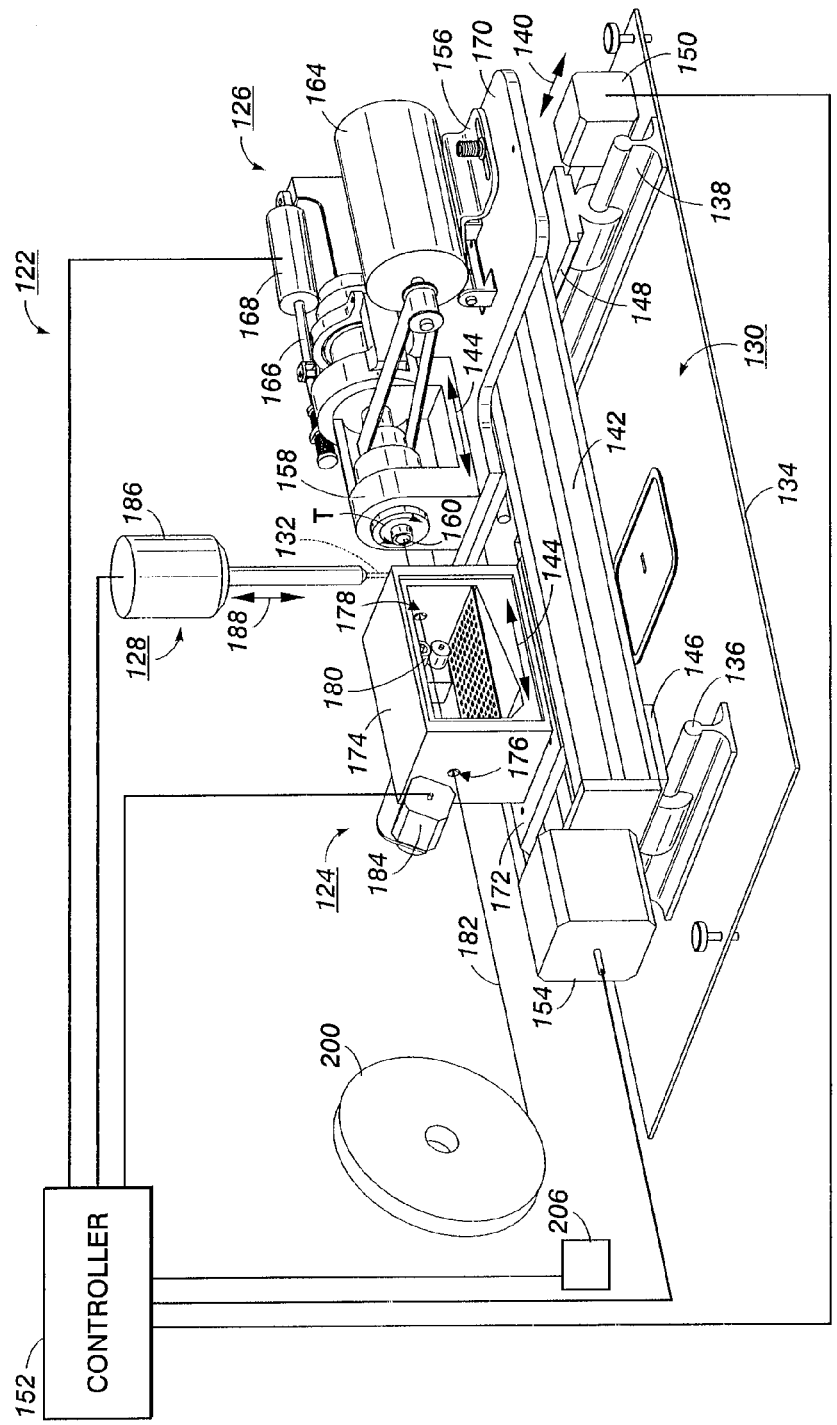
FIG. 9 is a simplified perspective view of a system for manufacturing components from a composite material.

The dependence of resistance of the subject rod element upon length is illustrated in one embodiment in FIG. 9. A combination of measurements of various samples of rod identified as sample "045-air aged" as described below were cut into various lengths ranging from about 6 mm to about 20 mm. Measurement data and model results were used to construct the graph of FIG. 9, which illustrates that the rod resistance increases monotonically with rod length. The rate of increase is calculated as the slope of the linear relationship, and has a value of +30.8. Thus the rod's resistance increases 30.8 ohms for each millimeter of added length.

The above-described approach to manufacturing electrical components is useful because the range of lengths of the composite plastic rod acceptable for use for the contact is typically significantly broader (i.e. ±10-20%) than the resistance range (±0.5%) generally required for function. Thus, variations in the final length of the contact, which are acceptable to the user, are employed as a controlling factor that is used to achieve tight resistance tolerance, which is required by the intended end use of the component.

The contact segment and often the overall assembly length usually have length specifications in the range of within about 20% of a target length which is typically 1-20% longer or shorter than the target length. Using the method described herein, a set or an array of electrical contacts can be formed in which each is formed from a segment of rod of the type described above and each has a resistance value within an acceptable tolerance of the others in the set or array.

Figure 6:
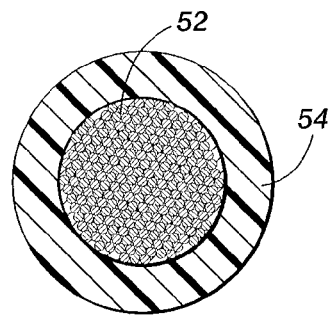
FIG. 6 is an end view of the embodiment shown in FIG. 5.

Another embodiment, shown in FIGS. 5 and 6, is an electrical component 50, such as a contact, having a fibrous core 52 that is coated with a coating layer 54, forming a coated rod 56. In the view shown in FIG. 5, a portion of the coating layer 54 has been removed, as is described further below. The coating layer resistance may be lower than the resistance of the fibrous core material or may be greater than the fibrous core depending upon what specific material composition is used to enable the resistance of the coating and of the core. In some cases, the resistance of the coating material can be 1.5 to ten times lower than the resistance of the fibrous core material. In other cases, the resistance of the coating material can be 1.5 to ten times higher than the resistance of the fibrous core material. In general and according to the embodiments disclosed herein, the resistance of the coating layer 54 is used to control the total resistance of the layer-on-core or shell-on-core composite's resistance. The coating layer may also be used to electrically couple the socket and the contact into an integrated assembly that has a desired target resistance. In this embodiment, the rod 56 is secured in a mounting member 58 which may be a circular shaped socket. Electrical interconnection between the mounting member 58 and the core 52 may optionally occur at the interface 51 between the base surface of the rod 56 and the internal base surface 59 of the mounting member 58, but typically is designed to reliably, primarily occur along some or all of the interface 55 between the coating layer 54 and the internal wall surface(s) 60 of the mounting member 58. The coating layer 54 has been applied to the outer surface of the core 52 along at least a portion of its length and optionally at the end portion 53 thereof and the contact 50 has been placed and secured in the mounting member 58. A small, precise amount of the coating is then removed from alongside of the contact end 57, usually but not necessarily completely down to the outer surface of the core 52 to achieve a desired specific resistance for the electrical component. When the resistance of the shell layer is greater than the resistance of the core, the total resistance of the shell-on-core configured device decreases in a predictable manner as small portions of the coating layer 54 are removed from the periphery of the electrical component 50.

The coating layer 54 may be applied to the contact element 52 in the form of a liquid comprising a controlled conductivity composite in a suitable solvent, or suitable dispersion, or mixture to comprise the coating having the desired resistance in the thin film, dry layer. Any suitable coating process can be used, including dip coating, spray coating, electrostatic spray, pad transfer or roll contact coating, and the like.

More than one coating layer comprising more than one coating material may be used to enable even greater control over the resultant resistance of the subject electrical element.

To understand the effect of removing portions of the coating layer of a shell-on-core configured composite, an equivalent electric circuit is modeled as two resistors in parallel with at least one additional resistance in series with those in parallel where the resistance of the coating or shell layer $R_{shell}$ is specifically selected to be, for example much higher than the resistance of the base or core layer $R_{core}$ when the length of the shell is initially the same as the length of the core. Incremental removal of portions of the coating layer by trimming the coating away from the core for a predetermined length along the periphery of the core serves to increase the effective total resistance of the original 2-layer component in a controllable and predictable manner. By appropriate selection of the coating material and resistance and/or its surface and volume resistivity, its application and trimming methodology, it is possible to process the composite to have very tight resistance tolerances. A numerical example can be used to illustrate the effect of trimming of the coating layer. The component consisting of a core rod of approximately 0.5 mm in diameter and 1.5 mm in length is surrounded by a resistive coating that is nominally 1000 ohms per millimeter in length along the surface of the core having a thickness of 1 micron. The coated rod is captured within a socket 58 which comprises a suitable end portion such as a surrounding metal collar that leaves a total of 1 mm of coated rod extending out of the socket (see FIG. 5). As earlier noted, the socket serves as a contacting electrode to establish electrical contact at one end of the composite rod and the collar region can serve as a contacting electrode to establish electrical contact along the side of the composite rod. A temporary contacting electrode is used to make electrical contact at the other end 57 whereby values of the end-to-end total resistance can be measured for any amount of coating that is removed along the length of the rod's periphery. This particular configuration is modeled as two resistors in parallel with one in series, where $R_{total} = (R_{shell} \times R_{core}/(R_{shell} + R_{core})) + R$ new core length. In addition, a constant resistance value is assumed (in this case equal to 20 ohms) to be in series with the above defined circuit to account for the series resistance that can occur between coated rod and collar. If one establishes values for $R_{shell} = 1000$ ohms and $R_{core} = 250$ ohms and a value for the resistance per length for the shell=100 ohm/mm and the R/L for the core=25 ohm/mm. One can then establish the resistance of the length of coated rod extending beyond the collar to be 220.0 ohms. If the target value that is required for the component is 225.0 ohms, then removal of the shell for a length of 0.10 mm will result in the required total resistance for the shell-on-core composite rod.

Figure 7:
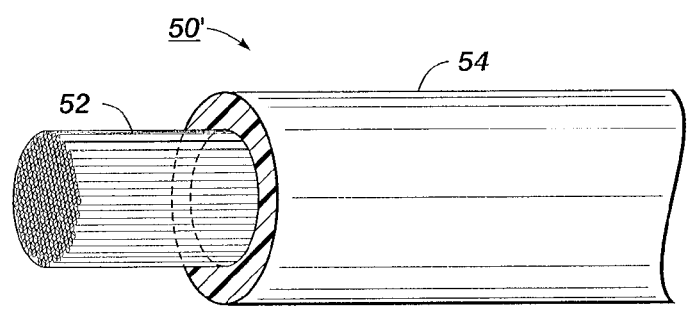
FIG. 7 schematically shows an electrical component with a portion of the outer coating layer removed.
Figure 11:
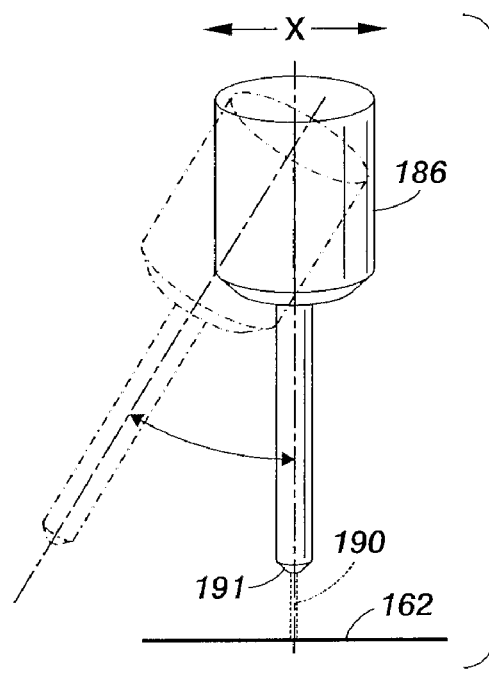
FIG. 11 is a schematic view of the fluidjet nozzle and the system X axis.

In one embodiment, a suitable process is used to selectively and completely remove the 0.10 mm length of coating away from the tip region 57 of a component similar to that shown in FIG. 5, resulting in an electrical component 50', shown in FIG. 7. Removal of additional coating for lengths greater than 0.1 mm serves to further increase the total resistance as illustrated in FIG. 11. Importantly, the rate of change in the total resistance as a function of length of coating that is removed can be calculated as the slope of the linear relationship which equals −5.0 ohms/mm. Clearly, if the trimming process typically can cut to a precision of 0.10 mm, then the resistance tolerance on the final part will fall within the range of 0.5 ohms, or +/−0.25 ohms, which is +/−0.1% of the target resistance.

Thus, before removal of the coating, the resistance of the component was equal to 220.0 ohms, which is clearly out of the allowable arbitrary specification by −5.0 ohms or 2.3% while the resistance after coating removal was calculated to be 225.0 ohms which precisely meets the target specification. In sum, trimming of the outer layer has been shown by this example to be useful for adjusting the effective resistance of the 2-layer component to achieve the desired target resistance. Importantly, the combination of a two layer shell-on-core design of the electrical component which is coupled with an appropriate process to selectively remove portions of the coating layer is shown herein to improve the degree of precision of a critical resistance parameter of the subject electrical component.

Two other cases exist where the resistance of the shell or coating layer is less than the core layer and where the resistance of shell and core are the same. In both of these cases, trimming of the shell layer serves to reduce the total resistance of the component in a predictable manner.

Further, the above two parallel resistor model only partially accounts for the component resistance of the component design depicted by the shell on core geometry as shown in FIG. 5. Since current, particularly DC and low frequency AC current, typically flows from the tip region 57 to the point where the coating appears 53 and then splits into two current paths, i.e. one through the core and one through the shell, and since the shell fully surrounds the core at the point(s) of intersection with the socket 58, the current must pass through the thickness of the shell in order to arrive at the socket. The hypothesis for current flows involving high frequency AC currents is that they tend to flow along outer surfaces of solid elements where relatively low surface-resistance paths exist. Thus, a more complex model consisting of two resistors in parallel (as described above) plus one resistor in series can be used to more accurately calculate the value of total resistance for this particular component configuration. In this case, $R_{total}$ can be calculated as the sum of $(R_{shell} \times R_{core}/(R_{shell}+R_{core}))+R_L$ where $R_L$ represents the resistance of the coating thickness that appears as an interface layer between the shell and socket. If the shell resistance is selected to be higher in resistance than the core then current will tend to flow essentially along the surface of the core-shell interface. If the shell resistance is selected to be lower than the core then the tendency for current will be to flow within and upon the shell. In either case, as stated earlier, selective trimming of the shell will tend to alter the total component resistance in a predictable manner.

The coating layer(s) can be any non-metallic material capable of being deposited over and adhered to the core layer to provide the desired final resistance value. Non-limiting examples of suitable coating materials include Aquadag®, and the carbon or graphite pigmented composite coatings known as "DAGs"®, including but not limited to DAG® 305, DAG® EB-30, and DAG® T-502, Electrodag® 154Resistance Coating, Electrodag® 402A, 403A, and 404A, Baytron® Antistatic coatings CPP301D, CPP 105, CPP 4531, and the like. Aquadag, Electrodag, and DAG are trademarked products supplied by Acheson Colloid, Port Huron, M I. Baytron is a registered trademarked product produced by H. C. Starck, GmbH & Co KG (Germany).

In making the electrical component, when no coating is included on the segment, it is usually precisely cut to form a component having a resistance variation of no more than + or −1.0%. The segment typically has a diameter in the range of about 5 micrometers up to 10 centimeter.

In most cases, the uncoated segments made from fiber and binder constitutes about 85 to 99 weight-percent fiber. With coated segments, typically about 75-99 weight percent of the composite segment is binder and about 0.1-10 weight percent of the segment is the coating.

In one embodiment, the core is formed from a plurality of individual carbon fibers that run lengthwise in a binder. A coating is applied over at least a portion of the core. A fluid jet or another suitable process, such as a laser, is used to cut the coated core to an appropriate length. For example, the waterjet cutting process described in U.S. Pat. No. 5,399,424 can be used. Next, small portions of the coating are removed, for example, by laser trimming or fluid jet cutting. In one embodiment, a numerically controlled, waterjet trimming process is employed to selectively remove a part of the resistance-controlling layer in accordance with a prescribed formula. Usually, the coating is removed from the tip of the component in a mill-machining process. In this context, mill-machining is a process whereby a thin layer of material is removed from the surface during rotatable contact between the narrow, high pressure jet and a moving tangent point on the outer diameter of the rod, as is shown in FIG. 7. Relative movement of the jet along the axis of the rod serves to determine the length of coating on the rod that is milled away. Movement along the radial direction serves to determine what depth of mill-cut is made into the rod. In this manner, the total resistance of the subject instrument probe can be precisely tuned.

Figure 8:
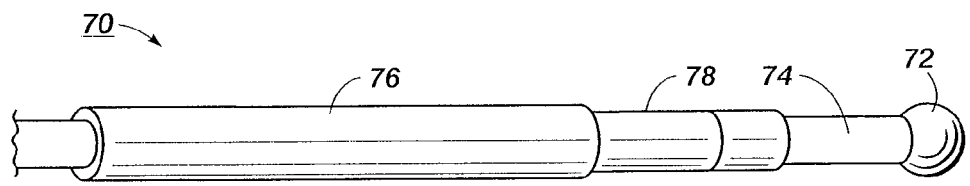
FIG. 8 schematically shows a further embodiment of an electrical component.

FIG. 8 schematically depicts another optional embodiment of an exampled miniature electrical component, designated as 70, comprising a relatively large, contact end 72 and a relatively small, supporting section 74 consisting of a segment having a diameter in the range of about 5 micrometers to about 10 cm wherein both the contact end 72 and the supporting section 74 comprise a plurality of resistive fibers in a binder. The supporting section 74 is affixed to a body member 76. A spring member 78, for example a compression coil spring, is provided which enables relative movement between the contact end supporting section 74 and the body member 76. Both members 76 and 78 are tubular in configuration. Member 76 has inner and outer diameters where the inner diameter is slightly larger than the outer diameter of the spring 78. This allows member 76 to extend over the spring member 78 such that 76 appears on both sides of 78. Upon contact by the contact end 72 placed under mating pressure to a test surface, a controlled contact force is established between the contact end 72 and test subject. Significantly, the contact end 72 is of a shape and size that can be different from the supporting section 74 and can be fabricated by the inventive process of cutting and milling as described above.

FIG. 9 is a simplified perspective view of a manufacturing system 122 for machining components from a composite material, such as CarbonConX™. The manufacturing system 122 includes a part collection and handling assembly 124 which in this embodiment comprises a vacuum box assembly, a lathe assembly 126, a fluid jet assembly 128 and an indexing assembly 130. A water jet or more generally stated, a fluid jet 132 that uses pure water, is used to cut and configure the face of the contact region because the fluid jet 132 uniquely produces a contact face having a surface that 1) can be profiled into a variety of desired shapes, profiles, and sizes, 2) is clean and free of contamination, 3) has a surface composition that closely mirrors the bulk composition, and 4) does not alter the chemical, electrical, or mechanical properties of the fiber or polymer. Furthermore, no noxious gases or liquids are used in fluid jet cutting and the process does not create hazardous materials or vapors. Unlike laser cutting, no heat affected zones or thermal-mechanical stresses are left on or within a fluid jet cut surface.

The part collection and handling assembly 124 and the lathe assembly 126 are mounted to a baseplate 134 by the indexing assembly 130. The indexing assembly 130 includes first and second Z rails 136, 138 that are fixedly mounted to the baseplate 134. The first Z rail 136 extends parallel to the second Z rail 138, defining a "Z" direction 140. An X slide 142 extends from the first Z rail 136 to the second Z rail 138, defining an "X" direction 144 that is perpendicular to the Z direction 140. First and second end portions 146, 148 of the X slide 142 are slidably mounted to the first and second Z rails 136, 138, respectively. A Z drive motor 150 is connected to the X slide 142 and to a controller 152 for moving the X slide 142 along the Z rails 136, 138 in the Z direction. The part collection and handling assembly 124 is slidably mounted to the X slide 142 proximate to first end portion 146 and the lathe assembly 126 is slidably mounted to the X slide 142 proximate to second end portion 148. First and second X drive motors 154, 156 are connected to the part collection and handling assembly 124 and the lathe assembly 126, respectively, and to the controller 152 for moving the part collection and handling assembly 124 and the lathe assembly 126 along the X slide 142 in the X direction 144.

The lathe assembly 126 includes a conventional lathe headstock 158, for example a Schaublin (Delémont, Switzerland) open headstock, having a collet 160 rotated in a direction T around the X axis 162 by a conventional lathe drive motor 164, for example a Schaublin drive motor. The collet 160 is operated by a lever 166 controlled by an air piston 168 connected to the controller 152. The headstock 158 and lathe drive motor 164 are fixedly mounted to a lathe table 170 that is slidably mounted to the X slide 142.

In the manufacturing system 122 shown in FIG. 9, the part collection and handling assembly 124 is a vacuum box assembly having a vacuum assembly table 172 slidably mounted to the X slide 142. A vacuum box housing 174 mounted to table 172 has material input and material output openings 176, 178 disposed substantially on the X axis 162. A support bushing 180 is disposed within the material output opening 178. As explained in greater detail below, when a composite rod 182 is being machined in the subject manufacturing system 122, the composite rod 182 extends through the material input and output openings 176, 178 to a proximate end that is gripped by the lathe collet 160, with the support bushing 180 supporting the composite rod 182 as it exits the vacuum box housing 174. A pair of pinch rolls (not shown) is mounted within the vacuum box housing 174, with the pinch rollers being disposed on opposite sides of the X axis 162. The pinch rollers are driven by a pinch roll motor 184 disposed on the exterior of the vacuum box housing 174.

Figure 10:
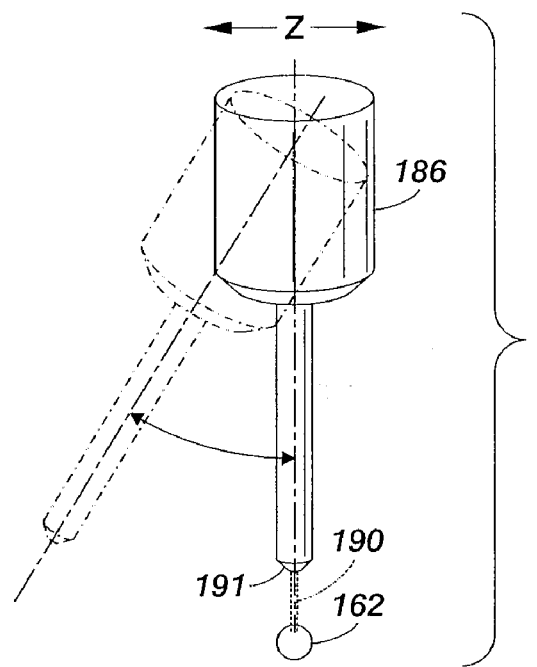
FIG. 10 is a schematic view of the fluidjet nozzle and the system Z axis.

A fluid jet assembly 128 is positioned such that the fluid jet assembly nozzle 186 is disposed intermediate the part collection and handling assembly 124 and the lathe assembly 126. The fluid jet assembly 128 includes positioning apparatus (not shown) for moving the nozzle 186 is in a "Y" direction 188, where the Y direction 188 is perpendicular to the X direction 144. The fluid jet assembly 128 may also include nozzle orientation apparatus for moving the nozzle tip relative to a Y axis 190, whereby the nozzle tip 191 may be moved in either the X direction 144 (FIG. 11) or the Z direction 140 (FIG. 10). The fluid jet assembly 128 includes a pump (not shown) that ejects a high pressure, narrow, continuous fluid jet 132 from the fluid jet nozzle 186 when it is energized. The fluid jet 132 may have a pressure of less than 10,000 psi to greater than 90,000 psi, preferably 30,000 to 60,000 psi, and most preferably 40,000 to 60,000 psi, and a diameter of about 0.002 inches to 1.020 inches, preferably 0.001 to 0.006 inches, and most preferably 0.002 to 0.004 inches. While conventional fluid jet devices utilize fluid borne abrasive particles as the cutting medium, the subject fluid jet assembly 128 does not require abrasive particles to machine the composite material. Abrasive particles may be added to the fluid jet 132 emitted from the fluid jet assembly 128 if the assembly is used to machine certain non-composite materials that may be otherwise difficult to cut such as very hard and/or very thick materials, for example titanium, composite carbon fiber/ceramic, and carbon/glass materials.

Abrasive particles may be added to the fluid jet to increase the relative speed or rate of cutting or machining. For example, abrasive particles can be used in the first of a two-stage process and then eliminated from the stream at a later stage of machining. Specifically, abrasive particles can be added to the stream and used first to rapidly cut or mill large portions of the material initially and then removed from the stream to enable a water-only jet that can be used to fine cut or fine mill and perhaps clean the final surfaces of the subject component. As explained in greater detail below, the subject system 122 can perform any required machining operation required to convert a composite material into a finished electrical component by positioning the fluid jet 132 relative to the Y direction 188 and positioning the lathe assembly 126 and part collection and handling assembly 124 relative to the Z and X axes.

Figure 12:
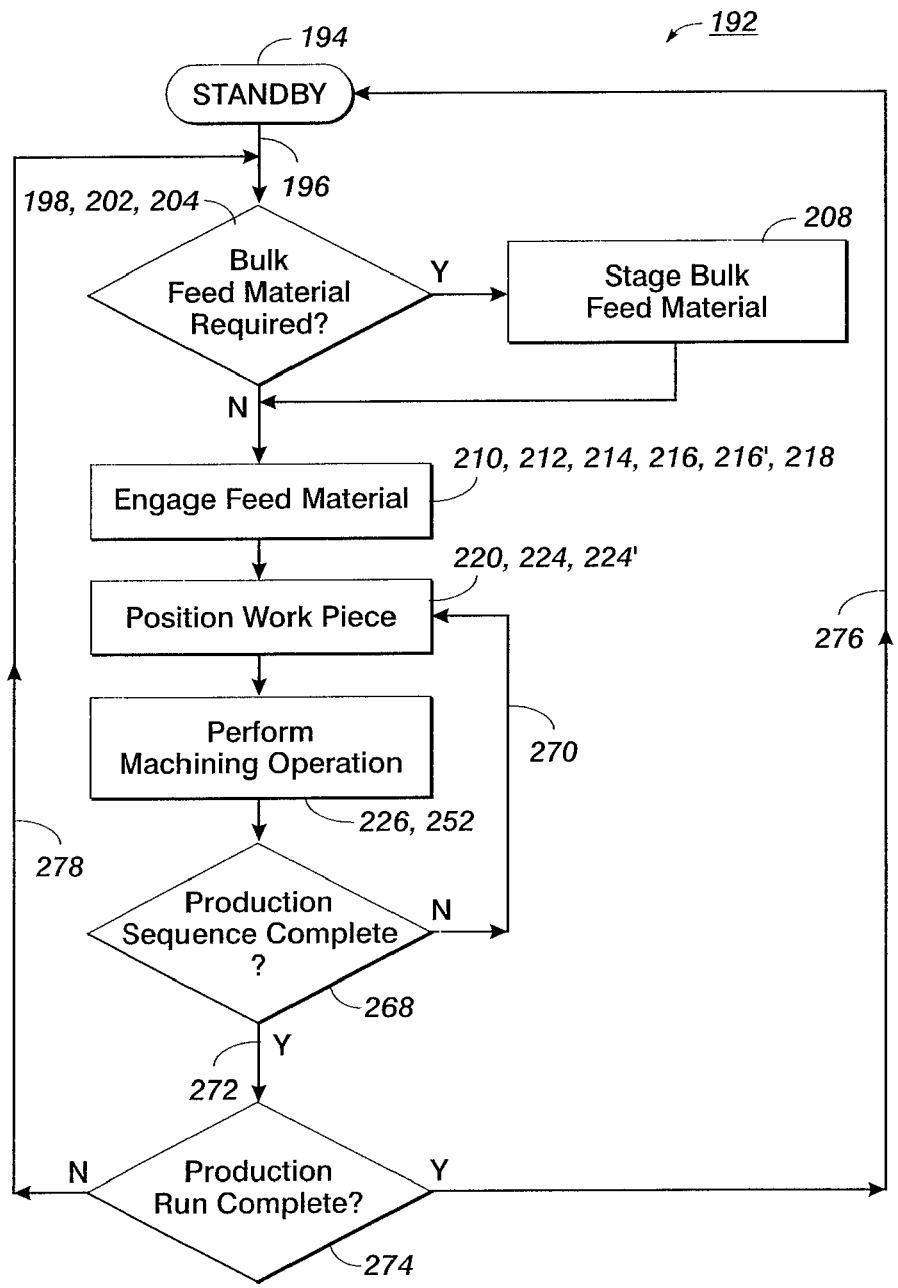
FIG. 12 is a flow diagram of the method of manufacturing components from a composite material.

An integrated, multi-step manufacturing operation, which optionally can be automated, can be used involving a specific machining sequence. FIG. 12 is a flow diagram of the method of manufacturing components 192 from a composite material. When it is idle or otherwise not actively in use, the manufacturing system 122 will generally be maintained in a standby 194 condition. If the manufacturing system 122 is not expected to be used for a period of time, for example during plant shutdown, it may be transferred from the standby condition to an off condition. The manufacturing system 122 may also be placed in the off condition during maintenance or repair operations.

When the manufacturing system controller 152 receives 196 an order to produce a component, it must first determine 198 whether feed material 200 is ready and positioned appropriately for use in the manufacturing operation. The controller may also use one or more sensors to confirm that feed material is present within the proper position and orientation within the system for the intended operation(s). Generally the feed material 200 is in the bulk form of a reel or coil 182 and when present in reel form is identified as a cable, coil or reel of composite material whereas when the feed material is in relatively short and generally in straight lengths, it may be referred to as a rod Alternatively, the feed material may be in the form of one or more discrete lengths of a circular rod of composite material having a set length. Optionally, two or more rods can be contained within a magazine feed apparatus (not shown). As explained in greater detail below, some manufacturing operations require workpieces that have undergone one or more machining operation to be removed from the manufacturing system 112 and then returned to the manufacturing system 122 for additional machining operations. In this case, the manufacturing system controller 152 will prompt the operator to insert one of these partially machined workpieces in the manufacturing system as discussed below.

Verification may be performed visually 202 by an operator or automatically 204 with sensor apparatus 206. For example, if the manufacturing system 122 is used to produce components from only one type of composite material, the sensor apparatus 206 may comprise a limit switch or similar device that is actuated when bulk feed material 200 is present. In a more advanced manufacturing system 122, the sensor apparatus 206 may comprise a weight sensor providing a real time value of the amount of feed material 200 disposed adjacent the part collection and handling assembly 124. The manufacturing system controller would utilize this value to determine when the available feed material 200 would be exhausted during the manufacturing operation. If the manufacturing system 122 is used to produce components from different types of composite material, the sensor apparatus 206 may include a sensor for determining the type of feed material disposed adjacent the part collection and handling assembly 124. For example, each unit (e.g. reel) of bulk feed material 200 may include a RFID or bar code having identification information for the unit stored therein. This information would be read by a RFID or bar code reader device of the sensor apparatus 206 and transmitted to the manufacturing system controller 152, which would verify that the unit of feed material available at the part collection and handling assembly 124 was the correct material for the manufacturing operation. If there is no feed material 200 available at the part collection and handling assembly 124, or if the wrong feed material is disposed at the part collection and handling assembly 124 the proper feed material 200 would be transported to the manufacturing system 122 and positioned adjacent the part collection and handling assembly 124. To complete staging 208 of the bulk feed material 200, the free end 201 of the composite cable 182 is positioned for engagement by the manufacturing system 122. Depending on the degree of automation of the system 122, this may require an operator to insert the cable free end 201 through the part collection and handling housing input opening 176 such that the cable free end 201 may be engaged 210 by the pinch rollers. Alternatively, the manufacturing system 122 may unreel the composite cable 182, guiding the cable free end 201 through the part collection and handling housing input opening 176 and into engagement 210 with the pinch rollers.

After engaging 210 the cable free end 201, the part collection and handling assembly pinch rollers draw 212 the composite cable 182 into the housing 174, pushing the cable free end 201 through the support bushing 180 and out of the part collection and handling housing through the material output opening 178. The lathe assembly collet 160 is opened 214, the part collection and handling assembly 124 is moved 216 in the X direction 144 toward the lathe assembly 126, and the lathe assembly 126 is moved 216' in the X direction 144 toward the part collection and handling assembly 124 until the cable free end 201 is positioned within the lathe assembly collet 160, which is then closed to grip 218 the cable free end 201.

Figure 13A:
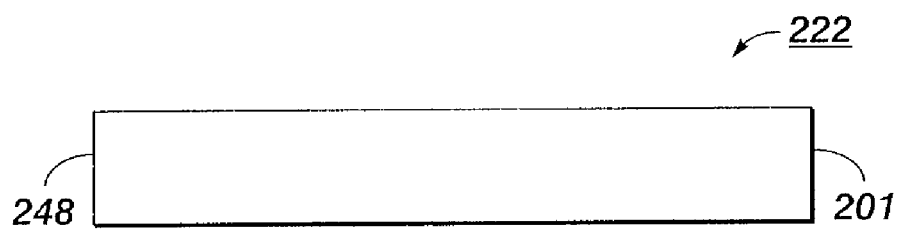
FIG. 13A-13C are schematic views illustrating the results of three machining operations on a workpiece.

To position 220 the workpiece 222 (FIG. 13A), the part collection and handling assembly 124 is then moved 224 in the X direction 144 away from the lathe assembly 126 and the lathe assembly 126 is moved 224' in the X direction 144 away from the part collection and handling assembly 124, until a predetermined length of the composite cable 182 is suspended between the part collection and handling and lathe assemblies 124, 126. It should be appreciated that the composite cable 182 is drawn through the part collection and handling assembly 124 as this movement of the part collection and handling and lathe assemblies 124, 126 occurs.

Figure 18:
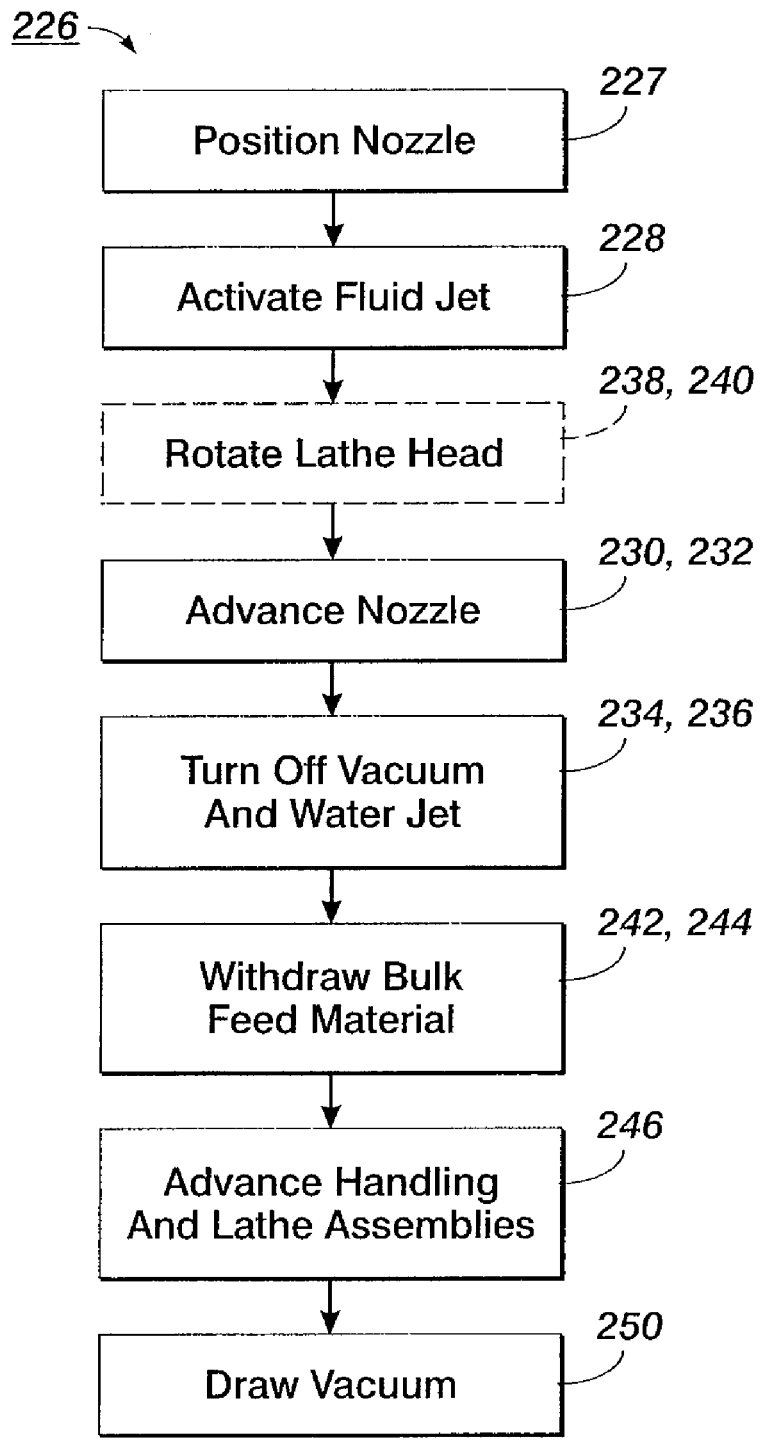
FIG. 18 is a flow diagram of the machining operations for separating a workpiece from the composite cable.

The first machining operation (FIG. 18) separates 226 the workpiece 222 from the bulk material 200. The fluid jet assembly 128 is positioned 227 such that a fluid jet 132 emitted by the fluid jet nozzle 186 is tangential to one side of the composite cable 182. Alternatively, the fluid jet nozzle 186 may be positioned such that the fluid jet 132 is perpendicular or at a pre-determined angle with respect to the axis of the workpiece. The fluid jet pump is energized 228 and nozzle 186 is moved 230 in the Z direction 140, whereby the high pressure, narrow, continuous fluid jet 132 emitted from the fluid jet nozzle 186 machines the segment of the composite cable 182 impacted by the fluid jet 132. The speed of the fluid jet nozzle 186 in the Z direction 140 is regulated 232 such that fluid jet 132 cuts off the length of the composite cable 182 between the fluid jet nozzle 186 and the lathe assembly 126. This length of composite cable is the workpiece 222. At the completion of this machining operation, the fluid jet pump is deenergized 234 and the vacuum is turned off 236. If a rod of composite material having a limited length is used as the feed material, instead of a longer coil, the pinch rollers may be disengaged 238 from the composite rod and the lathe head rotated 240 to facilitate the machining operation. The pinch rollers re-engage 242 the composite rod at the completion of the machining operation.

After the workpiece 222 has been separated from the bulk feed material 200, the pinch rollers withdraw 244 the composite cable 182 or rod back into the part collection and handling housing 174 until the new free end 201 is positioned just downstream of the pinch rollers. The lathe assembly 126 and the part collection and handling assembly 124 are advanced 246 in the X direction 144 toward each other until the cut end 248 of the workpiece 222 is inserted through the housing output opening 178 and into the support bushing 180. A vacuum is drawn 250 within the part collection and handling housing 174 to create a vacuum air bearing between the support bushing 180 and the workpiece 222.

Figure 19:
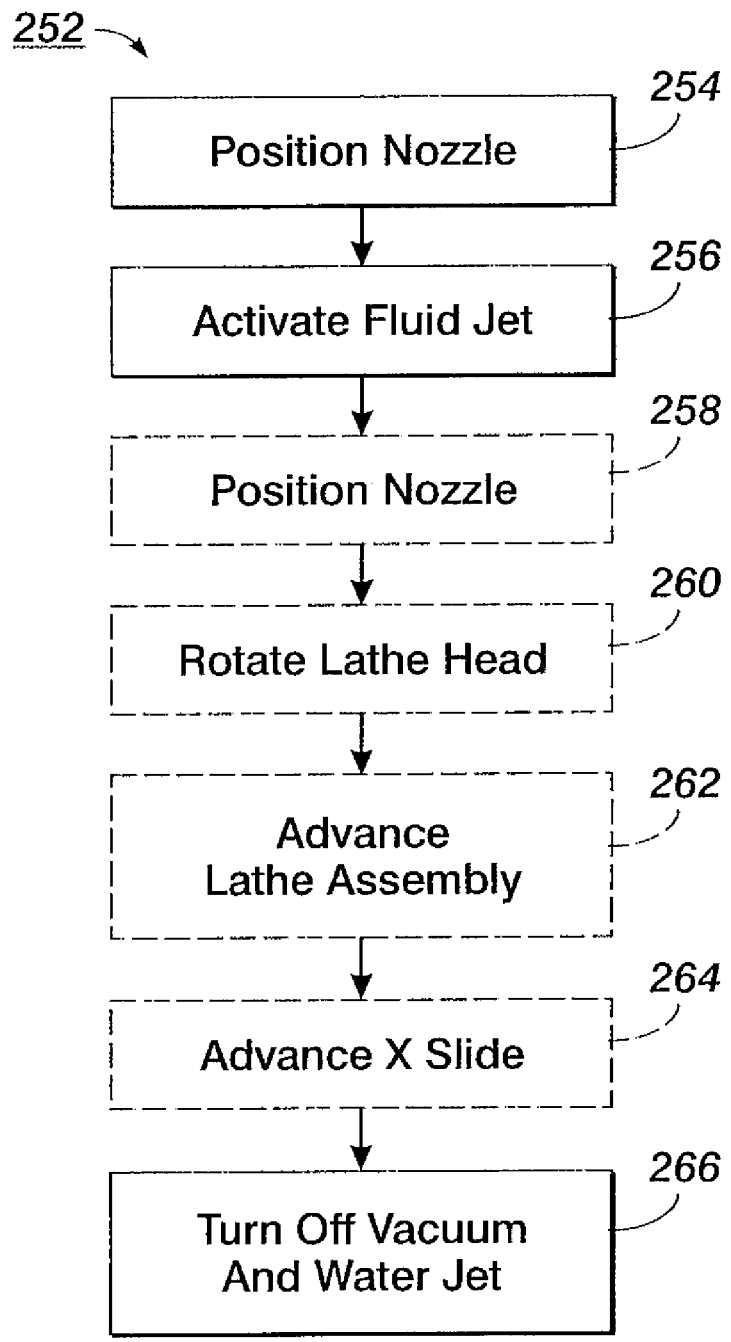
FIG. 19 is a general flow diagram for machining a workpiece.
Figure 20:
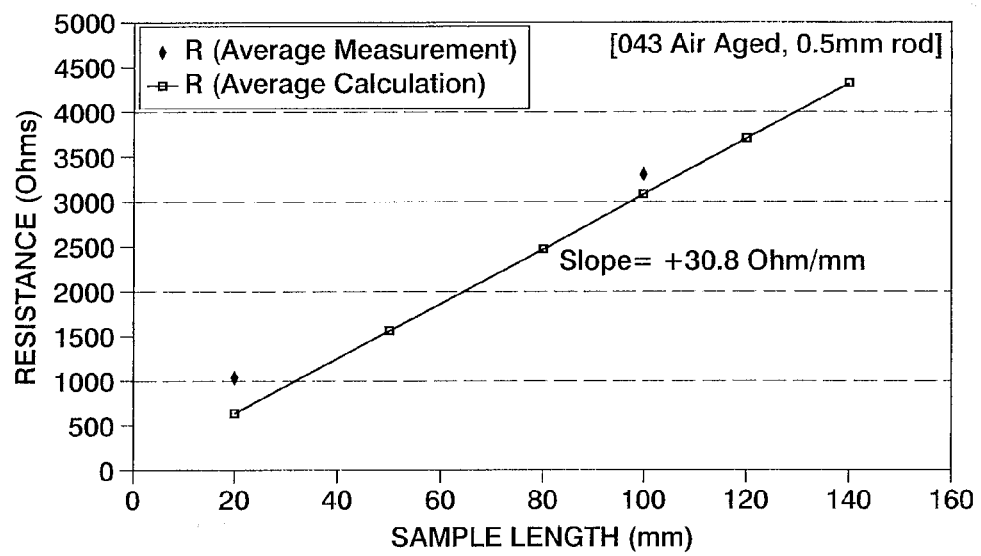
FIG. 20 is a graph showing electrical resistance as a function of sample length.
Figure 21:
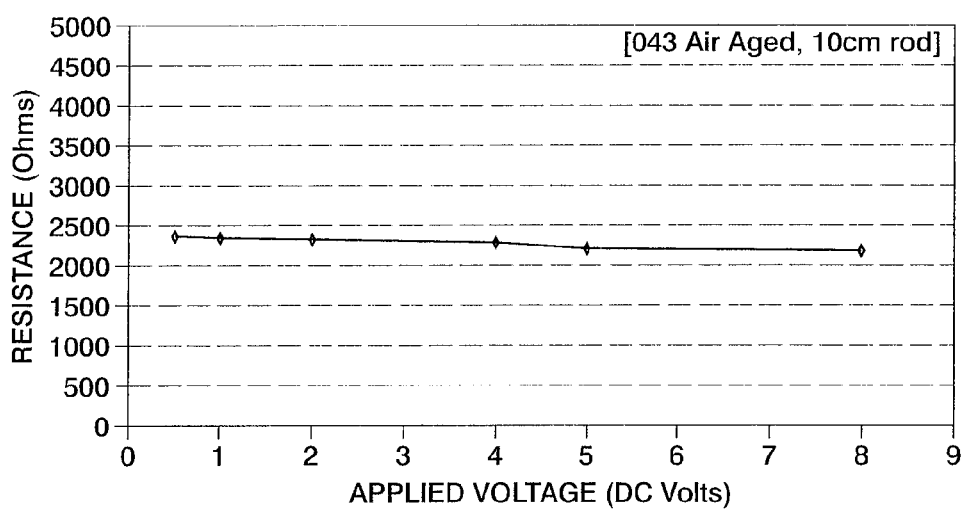
FIG. 21 is a graph showing sample electrical resistance per unit length as a function of applied potential.
Figure 22:
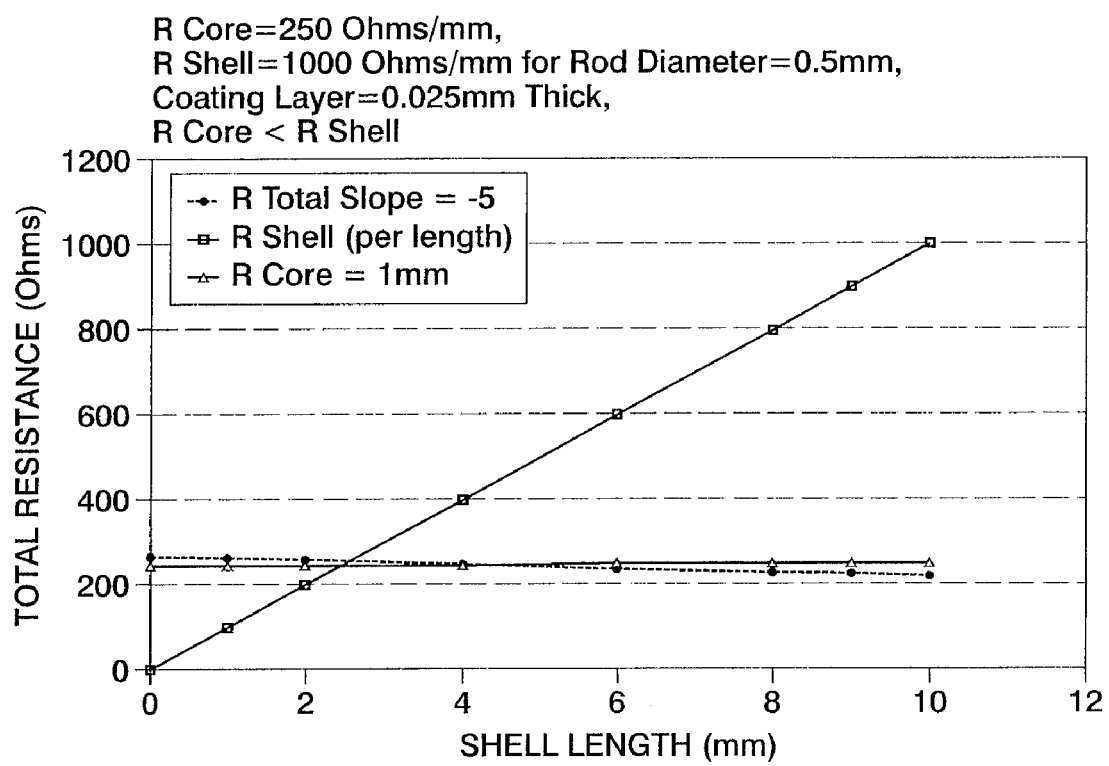
FIG. 22 is a graph showing total electrical resistance as a function of shell length.

With reference to FIG. 19, multiple machining operations 252 may be required to convert the workpiece 222 to the electrical component. Accordingly, the fluid jet nozzle 186 is moved in any of the X, Y or Z directions 144, 188, 140 that are necessary to position 254 the nozzle 186 to commence the next machining operation in the sequence of machining operations. The fluid jet pump is actuated 256 to impact the fluid jet 132 against the workpiece 222 in a first location, to commence the machining operation. The direction of fluid jet may be changed, by moving 258 the nozzle in any of the X, Y or Z directions to perform the machining operation. The lathe head may be rotated 260 and/or the lathe assembly may be moved 262 in the X direction 144 to perform the machining operation. The X slide 142 may be advanced 264 in the Z direction 140. When the machining operation is completed, the fluid jet pump is deenergized 266 and the manufacturing system controller 152 queries 268 the job instructions to determine whether the sequence of machining operations required to complete the production sequence has been completed. If not 270, and further machining operations are required, additional machining operations 252 are performed. If the production sequence is complete 272, the manufacturing system controller 152 queries 274 the job instructions to determine whether additional electrical components must be manufactured to complete the job order. If the job order is complete 276, the manufacturing system controller 152 returns the manufacturing system 122 to standby 194. If the job order is not complete 278, the manufacturing system controller 152 reinitiates the manufacturing operation, starting with verifying 198 that the feed material 200 required for the work order is positioned at the part collection and handling assembly 124.

Figure 15:
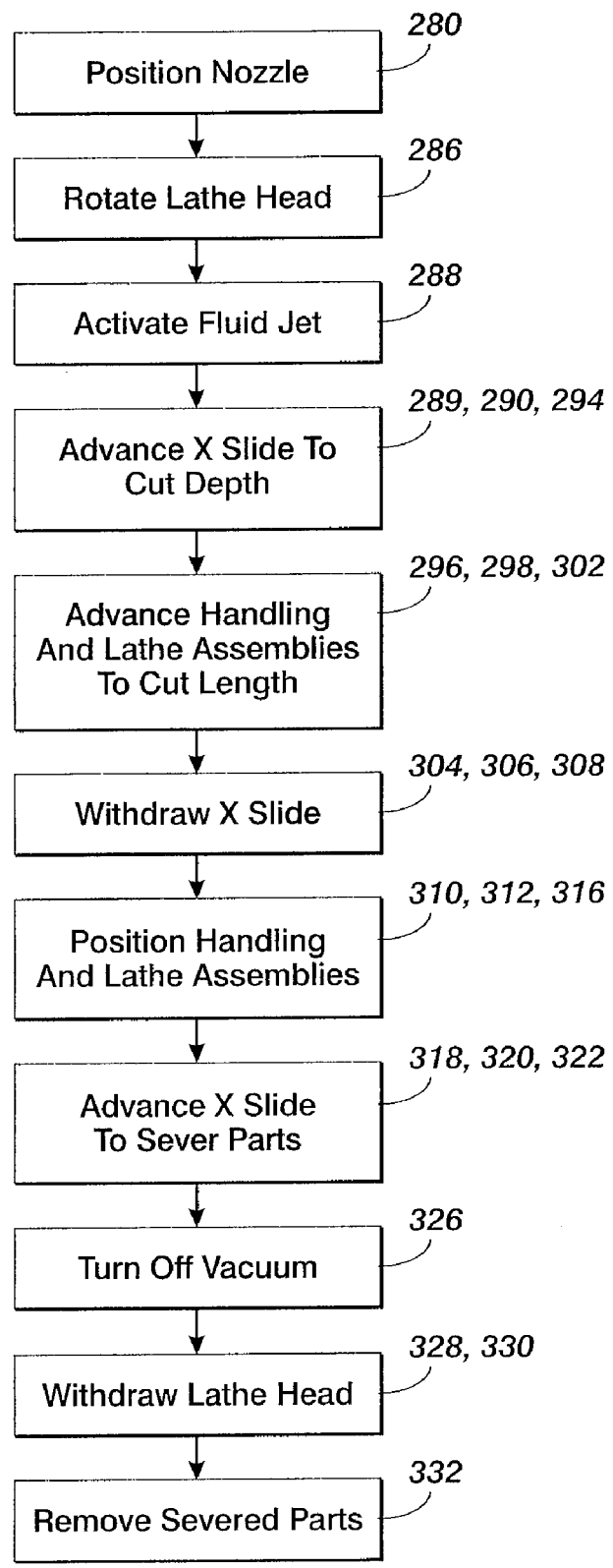
FIG. 15 is a flow diagram of the machining operations used to create the structures shown by FIGS. 13A-13C.
Figure 16:
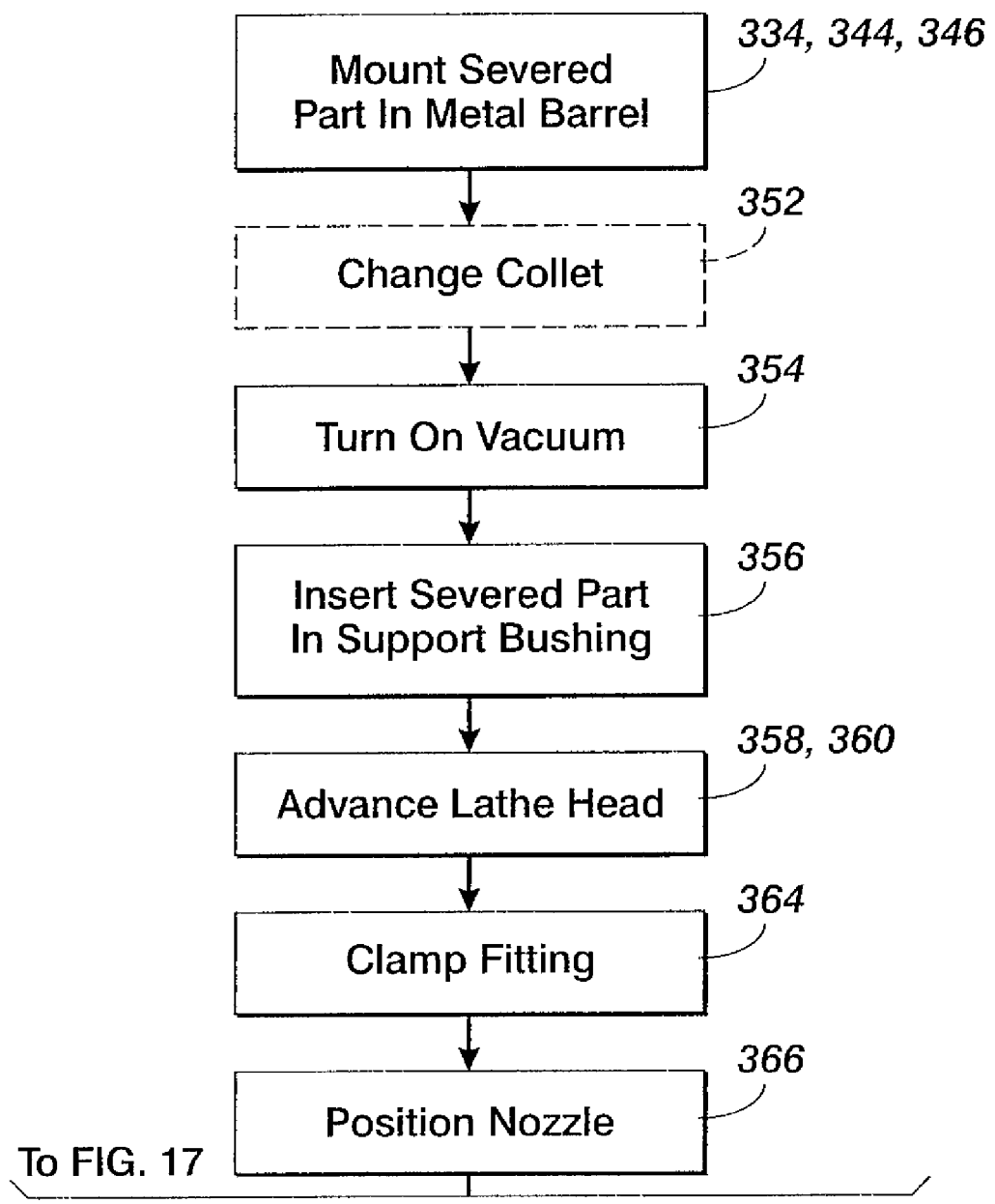
FIGS. 16 and 17 are a flow diagram of the machining operations used to create the structures shown by FIGS. 14A and 14B.
Figure 17:
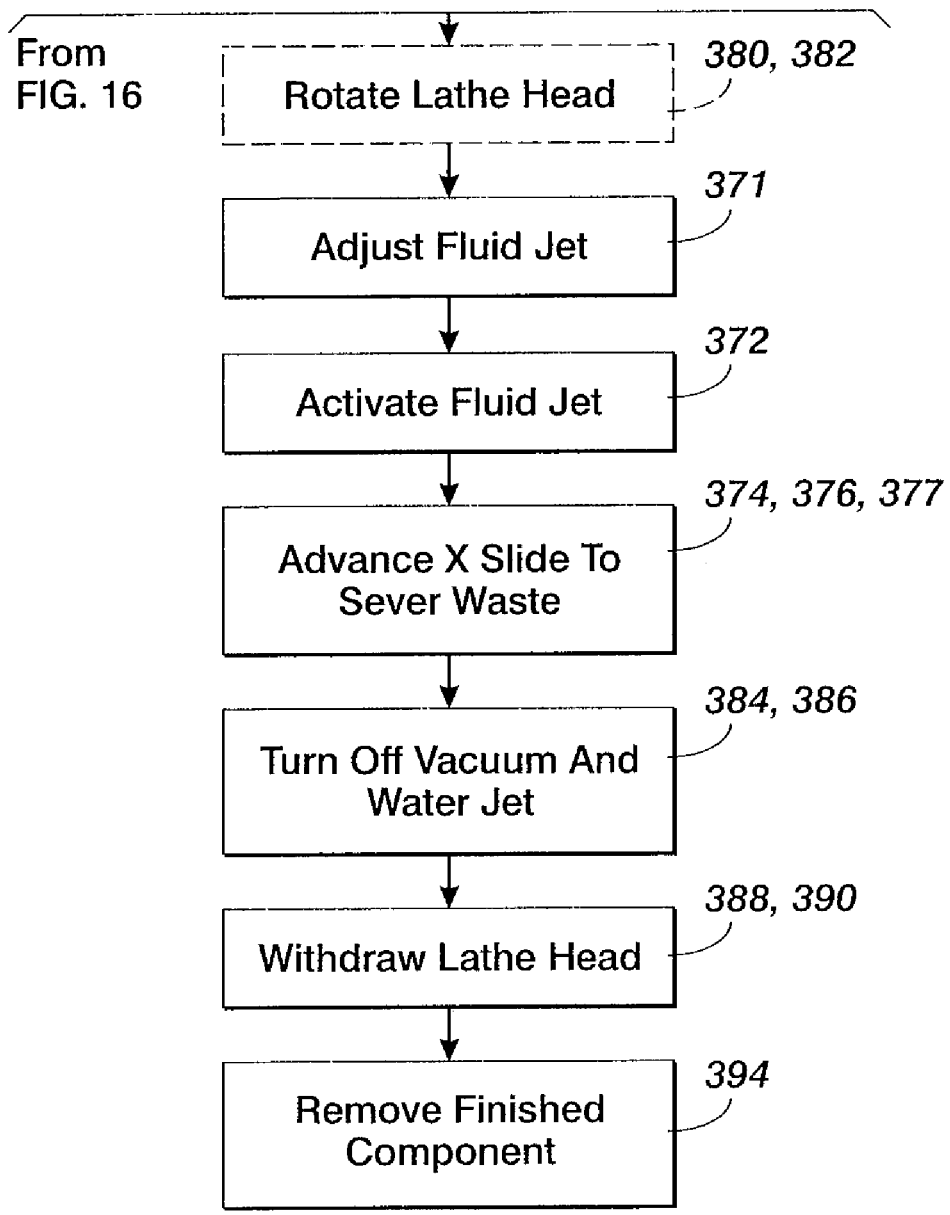

As explained above, a number of machining operations may be required to manufacture an electrical component, and intermediate manufacturing steps may have to be completed at locations remote from the subject manufacturing system. FIGS. 15, 16 and 17 are a flow diagram of the method of manufacturing one type of electrical component, including one example of the machining operations 252 of FIG. 12. FIGS. 13A-13C, 14A and 14B illustrate the changes to a workpiece 222 that is being worked on in accordance with this method.

Figure 13B:
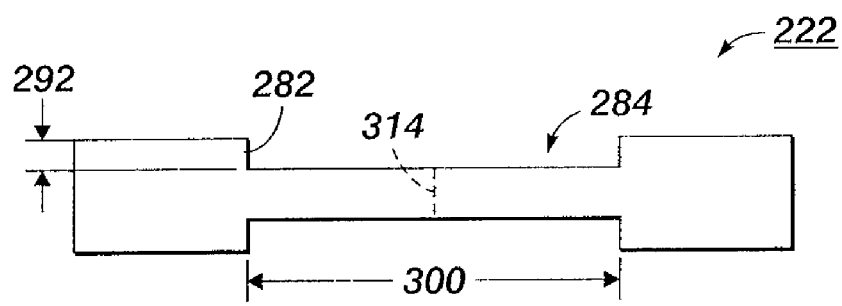
Figure 13C:
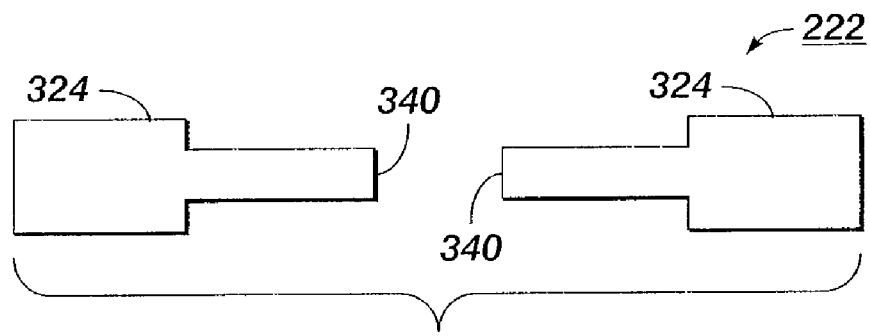

After the workpiece 222 has been positioned in the manufacturing system 122, the fluid jet nozzle 186 is moved in any of the X, Y or Z directions that are necessary to position 280 the nozzle 186 such that a fluid jet 132 emitted therefrom is tangential to the side of the workpiece 222 at one end 282 of the cut 284 (see FIG. 13B). The lathe assembly is activated to rotate 286 the lathe head at a predetermined speed, for example 3,000 RPM, and the fluid jet 132 is activated 288. The Z drive motor 150 is activated 289 to advance 290 the X slide 142 in the Z direction 140 such that the fluid jet 132 cuts into the surface of the workpiece 222 to the specified cut depth 292, at which point the Z drive motor 150 is deactivated 294. The X drive motors 154, 156 are activated 296 to advance 298 the part collection and handling assembly 124 and the lathe assembly 126 in the X direction 144 such that the fluid jet 132 machines composite material from the surface of the workpiece 222 for the specified length 300 of the cut 284, at which point the X drive motors 154, 156 are deactivated 302. In the example shown in FIG. 13B, the workpiece has a diameter of 0.020 inches and a length of 1.2 inches, the cut length 300 is 0.34 inches, and the cut depth 292 is 0.004 inches (yielding a diameter of 0.012 inches in the cut). The Z drive motor 150 is again activated 304 to withdraw 306 the workpiece 222 away from the fluid jet nozzle 186, and are then deactivated 308. The X drive motors 154, 156 are again activated 310 to position 312 the part collection and handling and lathe assemblies 124, 126 such that the fluid jet 132 is positioned at the midpoint 314 of the cut 284, and are then deactivated 316. The Z drive motor 150 is again activated 318 to advance 320 the workpiece 222 through the fluid jet 132, thereby severing 322 the workpiece 222 into two, substantially identical parts 324 (FIG. 13C). The vacuum is turned off 326, the X drive motors 154, 156 are activated 328 to withdraw 330 the lathe head away from the part collection and handling assembly 124 such that the severed parts 324 may be removed 332 from the part collection and handling support bushing 180 and the lathe collet 160. As described above, this process is repeated if additional parts must be produced for the production run.

Figure 14A:
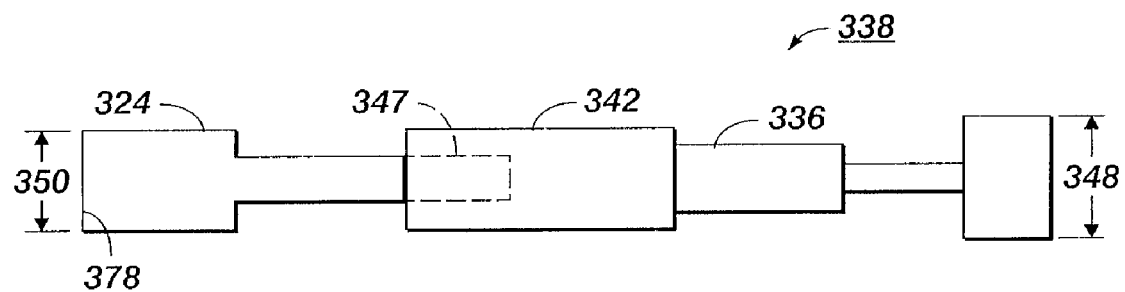
FIGS. 14A and 14B are schematic views illustrating the results of an intermediate manufacturing operation and the final machining operation on the workpiece of FIGS. 13A-13C.

Each of the severed parts 324 is mounted 334 to a metal fitting 336 to form a component assembly 338 (FIG. 14A). More specifically, the severed end 340 is inserted into a barrel 342 of the fitting 336 and fixedly mounted therein by crimping 344 the barrel 342 and/or gluing 346 with a suitable conductive, adhesive glue 347. If the outer diameter 348 of the fitting 336 is sufficiently different from the outer diameter 350 of the composite cable 182, the lathe collet 160 is changed 352 to accept the fitting 336. The vacuum is turned on 354 and the severed part 324 is inserted 356 into the support bushing 180. The X drive motors 154, 156 are activated 358 to advance the lathe assembly 126 toward the part collection and handling assembly 124 until the fitting 336 is inserted 360 into the collet 160. The end 362 of the fitting 336 is then clamped 364 in the lathe collet 160. The fluid jet nozzle 186 is moved in any of the X, Y or Z directions that are necessary to position 366 the nozzle 186 such that a fluid jet 132 emitted therefrom is tangential to the side of the workpiece severed part 324 at a position providing a contact segment 368 for the completed electrical component having the specified length 370.

Figure 14B:
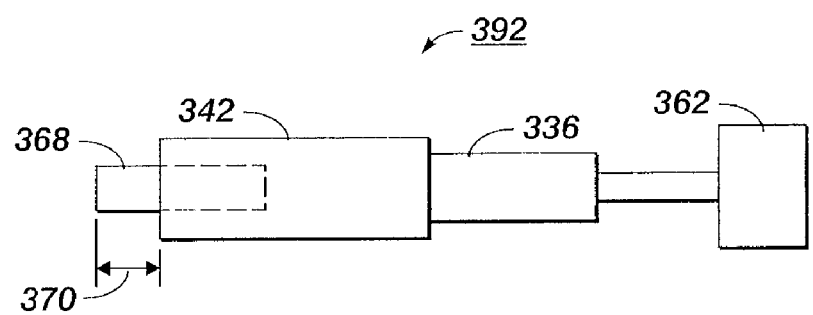

The y-axis position of the fluid jet 132 is adjusted 371 appropriately for desired part design and the jet is activated 372 and the Z drive motor 150 is activated 374 to advance 376 the severed part 324 through the fluid jet 132, thereby severing 377 the waste portion 378 of the severed part 324 from the contact segment 368 (FIG. 14B). The lathe assembly 126 may also be activated 380 to rotate 382 the lathe head. The vacuum and fluid jet are turned off 384, 386, the X drive motors 154, 156 are activated 388 to withdraw 390 the lathe head away from the part collection and handling assembly 124 such that the finished electrical component 392 may be removed 394 from the manufacturing system 122.

Although the above-disclosed manufacturing system has been described as suitable for use on carbon/polymer composite materials and generally circular rod-shaped members, it is equally suitable for non-circular shaped feed materials, for example oval-, square-, rectangular-trapezoidal- and other shaped feed materials can be successfully process including the aforedisclosed system. Likewise, the system is equally suitable to process a broad range of other materials which include particle and/or fiber filled polymers, elastomers, ceramics, glasses, and the like as well as combinations and alloys, or blends of the same. In general, the system is capable of processing any material in the form of a solid including composite foams, and bone, tissue, or other metal or non-metal imbedded in a host matrix material, and the like. Further, the process is flexible in that the feed material can be fed from the other direction meaning from the lathe assembly and head stock direction as opposed to the vacuum assembly direction.

The following examples show certain embodiments and are intended to be illustrative only. The materials, conditions, process parameters and the like recited herein are not intended to be limiting.

Example 1

A 0.022 to 0.023 inch diameter composite plastic rod (0.56-0.58 mm) was formed comprising 95 to 98% by weight of partially carbonized, polyacrylonitirile (PAN) fiber in the form of a continuous 3000 filament tow. The tow was supplied by MTLS, Inc., Marietta, Ga. The 3000 filament tow was sized with an appropriate sizing resin and used to pultrude a 500 foot length of continuous rod comprising approximately 2.0 to 5.0% by weight of Modar® 865 acrylic resin (Ashland Chemical Co.). Sufficient heat was applied to the composite to crosslink the binder resin and fiber reinforcement into a solid rod. The rod was allowed to cool to ambient room temperature and humidity and thereby air age until the electrical resistance was stable. The sample was identified as "043 air aged". Cutting short lengths of circular rod was done by use of conventional scissors to create a range of sample lengths spanning from 6 to 20 mm. The end-to-end DC resistance values were measured by a 2-pin method using a well known voltage-current technique over a range of applied voltages from 0.1 volts to 8.0 volts and back to 0.1 volts. Ohm's law was then used to calculate the resistance values from the voltage-current data.

FIG. 9 is a graphical plot of the resistance values for the various length samples as a function of their length as measured and compared to calculated values that were based using a slope of +30.8 ohms/mm as the instantaneous rate of change in resistance per mm of sample length. The resistance stability of these samples was within 0.5% and no significant hysteresis was observed due to the ramp up and ramp down of the applied voltage (see FIG. 10). A combination of measurement data and calculations was used to establish the effect of sample length upon sample resistance.

FIG. 9 shows a simple linear relationship between sample length and average sample resistance where the slope is equal to the above stated 30.8 ohms/mm. If one desired to produce large quantities of rods having an end-to-end resistance of exactly 300.0 ohms, then the length of each rod specimen would have to be cut to 9.74 mm in length. This clearly would be a challenge to any process that was intended to mass manufacture large quantities of these parts. If, on the other hand, a +/−1% tolerance were defined as the requirement for the target resistance, then the method for reliably cutting large production quantities of the rod would have to have a capability of cutting a resistive fiber-filled composite plastic rod-shaped member 12 (see FIG. 1) to an overall length to fall precisely in the range of 9.642 to 9.837 mm, which is a much easier task. This example illustrates the type of correlation that exists amongst cutting process capability, part length, characteristic resistance (per length) of the rod material and the achievement of the target resistance tolerance. Importantly, the length of rod is the variable that is used to achieve a desired target resistance for the component. Shorter rod lengths result in lower resistance values.

Example 2

A 0.022-0.023 inch (0.56-0.58 mm) diameter composite plastic rod was formed comprising 95 to 98% by weight of partially carbonized, polyacrylonitirile (PAN) fiber in the form of a continuous multi-filament tow. As in the above example, a 3000 filament tow was prepared that was sized with an appropriate sizing resin. In this example, a conventional thermal setting epoxy was used as the binder resin to pultrude the rod which comprised approximately 2.0 to 5.0% by weight of an epoxy resin that is identified as EPON Resin 826 and manufactured by Xexion Specialty Chemicals, Houston, Tex. Once the rod samples were cooled to room temperature, resistances were measured on a representative set of rod samples having a nominal length of 10 cm. The resistance values along with normalized resistance values (i.e. resistance per unit length) are shown below on Table 1 and in FIG. 10.

TABLE 1

| V applied (dc volts) | R/L (ohms/cm) |
|---|---|
| 0.5 | 236 |
| 1 | 234 |
| 2 | 232 |
| 4 | 229 |
| 5 | 221 |
| 8 | 219 |

The average resistance for this sample was found to be 228 ohms/cm (22.8 ohms/mm) which is significantly lower than the value reported in Example 1. It is believed that the reason for this difference is that a significantly higher process temperature was used with the epoxy resin based pultrusion process, which predictably caused a decrease in resistivity of the partially carbonized carbon fiber. Further, the resistance values indicate a slight dependence upon applied voltage. The diameter of this 0.022-0.023 inch diameter rod was milled down to 0.012 (0.3 mm) in diameter using the waterjet process described in a co-pending application entitled Carbon/Polymer Component Manufacturing System (which describes the specific fluid jet milling process), which is being jointly filed with and whose content is fully incorporated by reference into the present application. A value of 685 ohms/cm (68.5 ohms/mm) was calculated for the nominal resistance of the smaller diameter rod, which was confirmed by measurement. Thus, this example illustrates the utility of using fluid jet milling as a method to remove a shell layer of material that is compositionally the same through the rod and thereby effect a predictable change to the resistance of the resulting rod.

Example 3

A mathematical model was prepared in which, during or subsequent to the pultrusion process, a thin layer of a suitable conductive coating, such as Electrodag 402A (Acheson Industries, a National Starch & Chemical Co. holding) is applied by, for example, squeegee coating through a circular rubber orifice to the periphery of a nominal 0.95 millimeter diameter rod and allowed to dry and/or cure. The dried coating can have a thickness of 25 microns and the total diameter of the coated rod is 1 mm. The coated rod is then waterjet overcut to a length slightly greater than 1.5 millimeters, which is the part length required in a particular application. The contact is assembled into a collar, which is also referred to as a sleeve and secured by suitable adhesive at the interface between the sleeve and contact element. A length of rod slightly longer than 1 mm is left extending out of the sleeve. While not included in this particular example, in some cases, to avoid unwanted current flows between the sides of the rod and the sleeve, a suitable dielectric coating or layer can be positioned as a second layer between the sleeve inside diameter and the contact sides leaving the end of the rod to contact the base of the sleeve. The body of the sleeve is then used to mount and secure the assembly for rotary end-surface cutting by the waterjet, which is operated initially in the cutting mode to achieve the final desired length (which equates to 1.00 mm in this example) and end geometry (circular, flush cut in this example). The waterjet then is used in the milling-mode to remove a selected region of the coating layer (for example, for a predetermined length such as 0.10 mm) to thereby obtain the desired end-to-end resistance for this particular part.

Results as shown in FIG. 11 were calculated from a model which used earlier-defined parallel and series circuit resistance parameters. FIG. 11, shows that the resistance of the shell coating layer (uppermost curve in FIG. 11) by itself has a resistance of 1000 ohms at a length of 10 mm and 0 ohms at 0 mm length. Thus the slope is calculated to be +100 ohms/mm, while the slope of the relationship representing total resistance (i.e. core plus shell) is −5.0 ohms/mm. The resistance of the core member (shown as the middle curve of FIG. 11) remains constant and equal to 250 ohms, because neither its length nor diameter is altered by the coating layer milling. Significantly, change in the length of the coating layer is shown by this example to reduce the rate of resistance change (i.e. slope) of the particular member being processed and thereby increasing the effective processing precision.

Example 4

In this example, the above-described mathematical model of the proposed coated composite was used to evaluate a variety of design options. Table 2 below illustrates some of the scenarios that were analyzed. Latitude of the trimming process is defined as the range of resistance that can be used to achieve the desired tolerance range. The broader the range that exists and can be used to tune the composite resistance, the wider the latitude the tuning process has. As an example, if the tolerance required on the final part was 2 ohms (viz. 200 ohms±1 ohm), by selecting the resistivity and coating thickness of the overcoat to yield a $R_{shell}$ value of 2200 ohms for a core member that was measured to have a resistance of 220 ohms, the length of coating that can be removed from the element can span an effective range of about 230 ohms (viz. 2200 ohms±115 ohms) or ±5.2%. Alternately, if an overcoat having an $R_{shell}$ value of 20000 ohms for a core member that is measured to have a resistance of 202 ohms, then a trimming latitude of about 26000 ohms or c.±6.5% exists. Since ±6.5% is larger than ±5.2%, the later scenario has greater tolerance capability.

TABLE 2

| Target R (total) = 200 ohms | | |
|---|---|---|
| R core (ohms) | R shell (ohms) | Process latitude: I.e. Delta R (ohms) available to achieve target tolerance |
| 200 | 200 | 0 |
| 202 | 20000 | 26000 |
| 220 | 2200 | 230 |
| 300 | 600 | 18 |
| 400 | 400 | 8 |

The results shown on Table 2 clearly indicate that the resistance value of the core layer should be selected to be close to the desired value for the composite (for example within a factor of 2) and that the resistance of the outer-layer should be at least an order of magnitude higher to ensure that the process has wide latitude.

The manufacturing methods described herein are useful in making the electrical contact members of instrument probes such as oscilloscope probes and other devices used in high-speed, mixed signal IC circuit applications including, but not limited to, probing RF single chip devices, low voltage operational amplifiers, precision voltage reference circuits, analog frequency tuning circuits, and digital to analog and analog to digital converters.

It will be appreciated that variations of the above-disclosed and other features and functions, or alternatives thereof, may be desirably combined into many other different systems or applications. Also that various presently unforeseen or unanticipated alternatives, modifications, variations or improvements therein may be subsequently made by those skilled in the art which are also intended to be encompassed by the following claims. Unless specifically recited in a claim, steps or components of claims should not be implied or imported from the specification or any other claims as to any particular order, number, position, size, shape, angle, color, or material.

What is claimed is:

1. A method of making an electrical component, comprising:
   obtaining a segment of a material comprising a plurality of fibers in a binder,
   cutting the segment to a first length,
   measuring the electrical resistance of the cut segment,
   determining the amount of additional cutting required to obtain the desired electrical resistance of the segment, and
   precisely cutting the segment to a final length using at least one of a fluid jet and a laser.

2. The method of claim 1, further including mounting the cut segment in a support before measuring the resistance.

3. The method of claim 1, further including measuring the resistance of the segment after precisely cutting the segment.

4. The method of claim 1, further comprising drying the segment after precisely cutting the segment.

5. The method of claim 4, further including re-measuring the resistance of the segment after drying.

6. The method of claim 4, wherein the electrical component has a resistance within 0.5% of its desired resistance value.

7. The method of claim 4, wherein the segment has an outer end portion and the segment is cut to its final length by trimming the outer end portion.

8. The method of claim 4, wherein the segment comprises a core and a cover layer formed over the core, and the segment is cut to its final length by trimming the cover layer from the outer end portion of the segment without trimming the core.

9. The method of claim 8, wherein the core has a first electrical resistance and the cover layer has a second electrical resistance, and the second resistance is at least twice the first resistance.

10. The method of claim 4, wherein the segment is precisely cut to its final length using a laser.

11. The method of claim 1, wherein the electrical component has a resistance within 1 percent of its desired resistance value.

12. The method of claim 1, wherein the resistive fibers and binder are non-metallic.

13. The method of claim 1, wherein 85-99 weight percent of each segment is fiber and the remaining portion is binder.

14. The method of claim 1, wherein the electrical component has a diameter in the range of about 1 micrometer to about 10 cm.

15. The method of claim 1, wherein the electrical component is part of a set of electrical components, wherein each segment has a length within 20 percent of a target length for the set.

16. The method of claim 1, wherein at least a portion of the segments have a length that is at least 10-20 percent longer or shorter than the target length for the set.

* * * * *